United States Patent
Suligoj et al.

(10) Patent No.: US 12,062,699 B2
(45) Date of Patent: Aug. 13, 2024

(54) HORIZONTAL CURRENT BIPOLAR TRANSISTOR WITH SILICON-GERMANIUM BASE

(71) Applicant: University of Zagreb, Faculty of Electrical Engineering and Computing, Zagreb (HR)

(72) Inventors: Tomislav Suligoj, Zagreb (HR); Marko Koricic, Zagreb (HR); Josip Zilak, Zagreb (HR); Zeljko Osrecki, Zagreb (HR)

(73) Assignee: University of Zagreb, Faculty of Electrical Engineering and Computing, Zagreb (HR)

( * ) Notice: Subject to any disclaimer, the term of this patent is extended or adjusted under 35 U.S.C. 154(b) by 0 days.

(21) Appl. No.: 18/219,877

(22) Filed: Jul. 10, 2023

(65) Prior Publication Data
US 2023/0395666 A1 Dec. 7, 2023

Related U.S. Application Data

(62) Division of application No. 17/393,887, filed on Aug. 4, 2021, now Pat. No. 11,721,726.

(Continued)

(51) Int. Cl.
*H01L 29/165* (2006.01)
*H01L 29/08* (2006.01)
(Continued)

(52) U.S. Cl.
CPC ........ *H01L 29/165* (2013.01); *H01L 29/0808* (2013.01); *H01L 29/1008* (2013.01);
(Continued)

(58) Field of Classification Search
CPC ............... H01L 29/165; H01L 29/0808; H01L 29/1008; H01L 29/401; H01L 29/41708;
(Continued)

(56) References Cited

U.S. PATENT DOCUMENTS

| | | | |
|---|---|---|---|
| 8,569,866 B2 | 10/2013 | Suligoj et al. | |
| 8,772,837 B2 | 7/2014 | Suligoj et al. | |
| 2011/0266630 A1* | 11/2011 | Suligoj | H01L 29/1008 257/370 |

OTHER PUBLICATIONS

Suligoj et al.; "Horizontal Current Bipolar Transistor With a Single Polysilicon Region for Improved High-Frequency Performance of BiCMOS ICs"; IEEE Electron. Dev. Lett., vol. 31, 2010, pp. 534-536 (Year: 2010).*

(Continued)

*Primary Examiner* — Syed I Gheyas
(74) *Attorney, Agent, or Firm* — Stinson LLP

(57) ABSTRACT

A semiconductor device including a Horizontal Current Bipolar Transistor (HCBT) and methods of manufacture. The device has a semiconductor substrate of a first conductivity type defining a wafer plane parallel to the semiconductor substrate and has a base region and a collector region forming a first metallurgical junction. The device also has an emitter region forming a second metallurgical junction with the base region. A flat portion of the first metallurgical junction and a flat portion of the second metallurgical junction are substantially parallel to each other and close an acute angle with the wafer plane. At least a portion of the base region comprises silicon-germanium alloy or silicon-germanium-carbon alloy.

18 Claims, 17 Drawing Sheets

Related U.S. Application Data

(60) Provisional application No. 63/061,911, filed on Aug. 6, 2020.

(51) Int. Cl.
  H01L 29/10 (2006.01)
  H01L 29/40 (2006.01)
  H01L 29/417 (2006.01)
  H01L 29/66 (2006.01)
  H01L 29/735 (2006.01)
  H01L 29/737 (2006.01)
  H01L 21/8249 (2006.01)

(52) U.S. Cl.
  CPC ...... H01L 29/401 (2013.01); H01L 29/41708 (2013.01); H01L 29/66242 (2013.01); H01L 29/735 (2013.01); H01L 29/737 (2013.01); H01L 21/8249 (2013.01); H01L 29/66545 (2013.01)

(58) Field of Classification Search
  CPC ............. H01L 29/66242; H01L 29/735; H01L 29/737; H01L 21/8249; H01L 29/66545; H01L 29/0649
  See application file for complete search history.

(56) References Cited

OTHER PUBLICATIONS

Heinemann, B., et al., "SiGe HBT Technology with FT/f max of 300GHz/500GHz and 2.0 ps CML Gate Delay," IEEE International Electron Devices Meeting, San Francisco, CA., 2010, pp. 688-691.

Pekarik, J.J., et al., "A 90nm SiGe BiCMOS Technology for mm-wave and high performance analog applications," IEEE Bipolar/ BiCMOS Circuits and Technology Meeting (BCTM), Coronado, CA, USA, 2014. pp. 92-95.

Harame, D.L., et al., "Current Status and Future Trends of SiGe BiCMOS Technology," IEEE Transactions on Electrion Devices, 2011, vol. 48, No. 11, pp. 2575-2594.

Böck, J., et al., "SiGe HBT and BiCMOS Process Integration Optimization within the DOTSEVEN project," IEEE Bipolar/ BiCMOS Circuits and Technology Meeting—BCTM, Boston, MA, 2015, pp. 121-124.

Ning, T.H., "A Perspective on SOI Symmetric Lateral Bipolar Transistors for Ultra-Low-Power Systems," in IEEE Journal of the Electron Devices Society, 2016, vol. 4, No. 5, pp. 227-235.

Hamel, J.S., et al., "Technological Requirements for a Lateral SiGe HBT Technology Including Theoretical Performance Predictions Relative to Vertical SiGe HBTs," IEEE Transactions on Electron Devices, 2002, vol. 49, No. 3, pp. 449-456.

Derrickson, A., et al., "Assessment of THz Performance for a Lateral SiGe HBT on SOI With a Laterally Graded Base," IEEE Transactions on Electron Devices, 2018, vol. 65, No. 11, pp. 4747-4754.

Suligoj, T., et al., "Horizontal Current Bipolar Transistor With a Single Polysilicon Region for Improved High-Frequency Performance of BiCMOS ICs," i EEE Electron Device Letters, 2010, vol. 31, No. 6, pp. 534-536.

Koričić, M., et al., "A High-Voltage Single-Emitter Reduced-Surface-Field Horizontal Current Bipolar Transistor for BiCMOS Integration," IEEE Transactions on Electron Devices, 2017, vol. 64, No. 7, pp. 3019-3022.

Suligoj, T., et al., "Collector Region Design and Optimization in Horizontal Current Bipolar Transistor (HCBT)," IEEE Bipolar/ BiCMOS Circuits and Technology Meeting (BCTM), Austin, TX, USA, 2010, pp. 212-215.

Chevalier, P., et al., "SiGe BiCMOS Current Status and Future Trends in Europe," IEEE BiCMOS and Compound Semiconductor Integrated Circuits and Technology Symposium (BCICTS), San Diego, CA, 2018, pp. 64-71.

\* cited by examiner

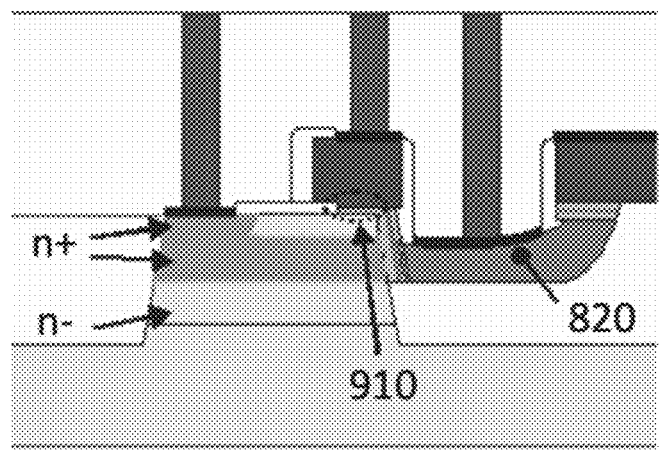
FIG. 9A
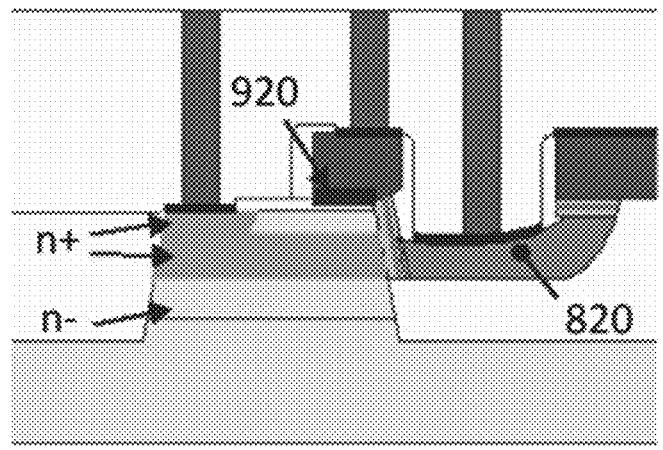
FIG. 9B
FIG. 10
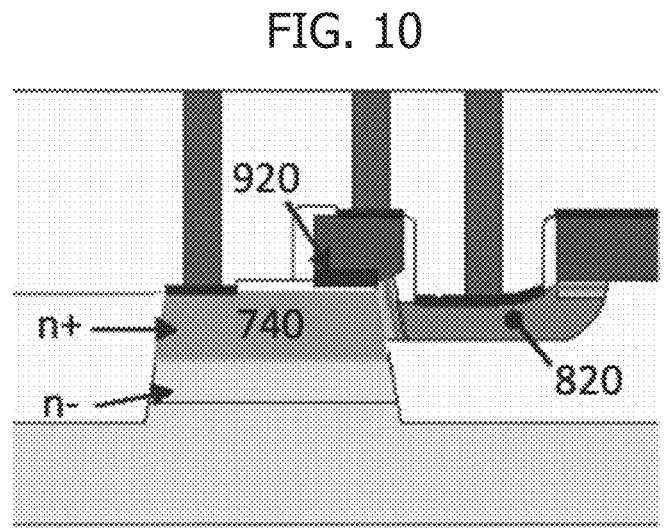

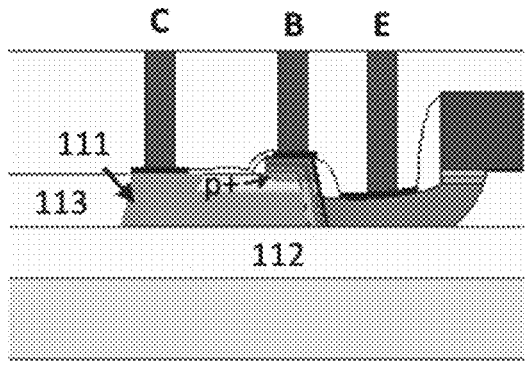
FIG. 11A
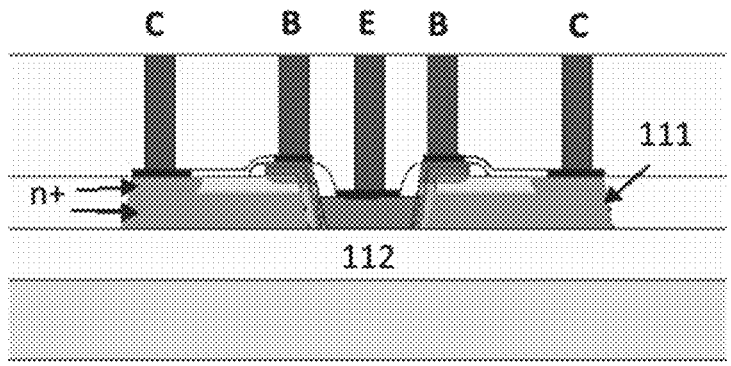
FIG. 11B
FIG. 12
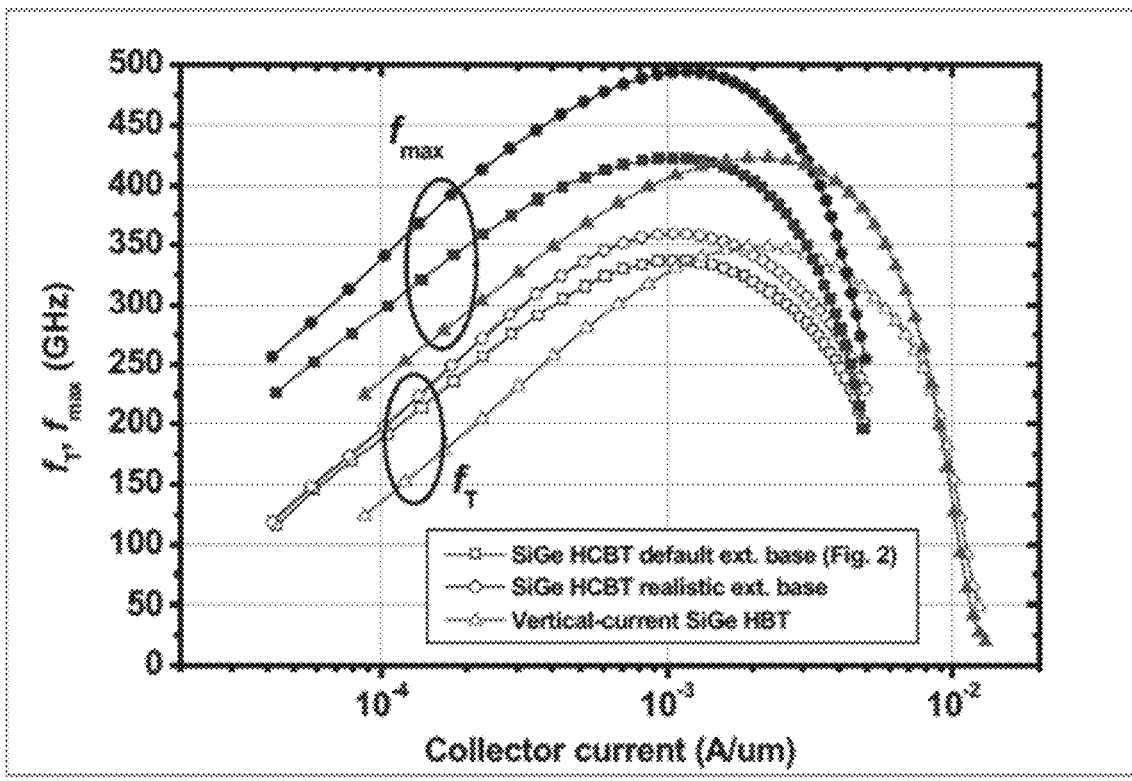

HORIZONTAL CURRENT BIPOLAR TRANSISTOR WITH SILICON-GERMANIUM BASE

CROSS-REFERENCE TO RELATED APPLICATION

This application is a divisional of U.S. patent application Ser. No. 17/393,887, filed Aug. 4, 2021, which claims priority to U.S. Provisional Patent Application No. 63/061,911, filed Aug. 6, 2020, the entire contents of which are incorporated herein by reference for all purposes.

TECHNICAL FIELD

The invention relates to the Horizontal Current Bipolar Transistors (HCBT), using Silicon-Germanium (SiGe) base and having improved characteristic parameters. Preferred structures of HCBT with SiGe base and methods of manufacturing therein, are described.

BACKGROUND

State-of-the-art SiGe Heterojunction Bipolar Transistors (SiGe HBTs) have achieved astonishing performance demonstrating record cutoff frequency (fT) and maximum frequency of oscillations (fmax) in the range of 505-720 GHz when they are manufactured in standalone configuration, in which case the whole process is optimized for their characteristics.

See for example:
[1] B. Heinemann et al., "SiGe HBT with fx/fmax of 505 GHz/720 GHz," 2016 IEEE International Electron Devices Meeting (IEDM), San Francisco, CA, 2016.

In another configuration, bipolar transistors are fabricated in the same process with Complementary-Metal-Oxide-Semiconductor (CMOS) transistors, resulting in the Bipolar CMOS (BiCMOS) technology, where the most advanced SiGe HBTs have fT and fmax in 300-400 GHz range. Such performance makes them suitable for Radio Frequency (RF) and millimeter-Wave (mmW) applications as well as for high-performance Analog and Mixed-Signal (AMS) circuits.

Examples of this type can be found in the following papers:
[2] J. J. Pekarik et al., "A 90 nm SiGe BiCMOS technology for mm-wave and high performance analog applications," 2014 IEEE Bipolar/BiCMOS Circuits and Technology Meeting (BCTM), Coronado, CA, 2014, pp. 92-95.
[3] P. Chevalier et al., "SiGe BiCMOS Current Status and Future Trends in Europe," 2018 IEEE BiCMOS and Compound Semiconductor Integrated Circuits and Technology Symposium (BCICTS), San Diego, CA, 2018, pp. 64-71,
[4] J. Böck et al., "SiGe HBT and BiCMOS process integration optimization within the DOTSEVEN project," 2015 IEEE Bipolar/BiCMOS Circuits and Technology Meeting—BCTM, Boston, MA, 2015, pp. 121-124,
[5] T. H. Ning, "A Perspective on SOI Symmetric Lateral Bipolar Transistors for Ultra-Low-Power Systems," in IEEE Journal of the Electron Devices Society, vol. 4, no. 5, pp. 227-235, September 2016

In comparison with the CMOS standard process, a number of fabrication steps must be added to the manufacturing process flow to obtain such high-performance self-aligned SiGe HBTs, generally comprising the steps of forming two Polysilicon layers, one or more epitaxial growths, deep trenches, multiple spacers and other isolation and/or sacrificial layers. Although SiGe HBTs is implementable several technology nodes behind CMOS transistors with competitive or better RF performance, the addition of those fabrication steps and lithography masks notably increases the cost of technology.

Furthermore, their high-breakdown voltage makes HBTs useful for higher-swing applications, such as RF power amplifiers, but their fabrication in the same manufacturing process with high-speed transistors usually requires various collector implantation schemes, increasing the number of added masks and steps further.

Lateral Bipolar Transistors (LBTs) could principally provide a viable solution for a tradeoff between technological complexity and high-performance due to their compact structure where intrinsic transistor regions, representing mainly the active part of the device, almost coincides with the total area of the p-n junctions, with a reduced volume of parasitic regions and are more easily accessible from the Silicon surface. However, their electrical characteristics in pure-Silicon are inferior to those of standard vertical-current transistors so far due to the unoptimized doping profile of the intrinsic transistor region.

See for example:
[6] J. S. Hamel, Y. T. Tang and K. Osman, "Technological requirements for a lateral SiGe HBT technology including theoretical performance predictions relative to vertical SiGe HBTs," in IEEE Transactions on Electron Devices, vol. 49, no. 3, pp. 449-456, March 2002,
[7] A. Derrickson, A. H. Peterson, K. English, A. Haslam, S. Nath and J. F. McDonald, "Assessment of THz Performance for a Lateral SiGe HBT on SOI With a Laterally Graded Base," in IEEE Transactions on Electron Devices, vol. 65, no. 11, pp. 4747-4754, November 2018.

Horizontal Current Bipolar Transistors (HCBTs) so far are the most advanced lateral-current-flow devices, as they have demonstrated optimum doping profile with low volume of parasitic regions and are the highest-speed implanted-base bipolar transistors fabricated in pure-Silicon, without the addition of SiGe technology.

For example, in the U.S. Pat. No. 8,569,866, a configuration of a lateral transistor suited for the hybrid-integration (BiCMOS) of a high-performance HCBT with CMOS transistors, and a method for manufacturing therein, are provided.

Another example can be found in:
[8] T. Suligoj, M. Koričić, H. Mochizuki, S. Morita, K. Shinomura and H. Imai, "Horizontal Current Bipolar Transistor With a Single Polysilicon Region for Improved High-Frequency Performance of BiCMOS ICs," in IEEE Electron Device Letters, vol. 31, no. 6, pp. 534-536, June 2010.

HCBTs are integrable with CMOS transistors in low-cost technology and have the capability to adjust the breakdown voltage value without any increase in process complexity, just by layout manipulation.

See for example:
[9] M. Koričić, J. ilak and T. Suligoj, "A High-Voltage Single-Emitter Reduced-Surface-Field Horizontal Current Bipolar Transistor for BiCMOS Integration," in IEEE Transactions on Electron Devices, vol. 64, no. 7, pp. 3019-3022, July 2017,
[10] U.S. Pat. No. 8,772,837B2 (T. Suligoj, 2014).

Due to lateral current flow, the electric field from collector can be shielded in various ways: by recessed CMOS p-well region increasing the "Breakdown Voltage, Collector-Emitter, base Open" ($BV_{CEO}$) above 10 V; by double emitter structure with $BV_{CEO}$>12 V; by double emitter structure with recessed p-well with $BV_{CEO}$>36 V; and by floating field plates with $BV_{CEO}$>45 V. Such a wide range of breakdown voltages in the same technology enables: (i) the implementation of high-voltage circuits currently covered by Bipolar-CMOS-DMOS (BCD) process in HCBT technology, (ii) integration of such high-voltage (i.e., power-management and/or analog) circuits with RF circuits.

Therefore, the HCBT concept provides high flexibility in implementing transistors with wide range of breakdown voltages in the same Silicon substrate and by the same fabrication process flow. Furthermore, by adding SiGe base to HCBT structure it is possible to achieve an improvement in transistor's high-frequency performance resulting in HCBT Bipolar CMOS (BiCMOS) technology that covers the widest range of applications, from highest-speed to high-voltage ones.

It is therefore desirable to provide a process to manufacture HCBT using SiGe base (SiGe HBTs) that is less complex, less expensive and generates devices with improved parameters.

SUMMARY OF THE DISCLOSURE

According to an aspect of the present invention, different embodiments of the method of manufacturing of a semiconductor device including improved Horizontal Current Bipolar Transistors comprising Silicon-Germanium base (SiGe HCBT), are described.

A method of manufacturing a semiconductor device including improved SiGe HCBT, according to an aspect of the present invention, is based on the standard semiconductor technology steps used in the manufacturing method of the existing vertical-current SiGe HBTs.

A method of manufacturing a semiconductor device including improved SiGe HCBT, according to further another aspect of the present invention, includes a fabrication sequence based on HCBT Bipolar CMOS (BiCMOS) technology, integrating the specific Bipolar junction transistor process steps with those of the standard (complementary metal-oxide-semiconductor) CMOS technology in a single integrated process flow.

A method of manufacturing a semiconductor device including improved SiGe HCBT, wherein a step of manufacturing the SiGe HCBT includes the steps of: providing a semiconductor substrate; forming an n-hill region by etching revealing said substrate; depositing an isolation layer disposed on the revealed substrate surrounding the n-hill; forming a doped collector region in said n-hill by ion implantation; forming a dummy gate polysilicon on top of said isolation layer; depositing a silicon nitride film over the entire surface; opening an emitter trench wherein said emitter trench is disposed between said n-hill region and said dummy gate polysilicon; epitaxially growing a base layered structure layer, comprising of at least one doped layer including Germanium, Carbon or other impurities at the top and sidewall surfaces of said n-hill region, wherein an intrinsic base region is formed therein; forming an extrinsic base region by ion implantation into the portion of said base layered structure layer at the top surface of the n-hill active region; forming a protective layer for protecting the intrinsic and extrinsic base regions during subsequent etching steps; forming an amorphous or polysilicon or crystalline film filling the emitter trench and shape it to a predetermined thickness; forming a collector contact region in the n-hill region by ion implantation; forming an emitter diffusion region in the grown layer of intrinsic base region by solid-phase diffusion from the amorphous or polysilicon film; forming an electrodes directly connected to the collector contact region, the extrinsic base region and to the emitter contact region.

A method of manufacturing of a semiconductor device including improved SiGe HCBT, according to yet another aspect of the present invention, includes the step of providing a semiconductor substrate belonging to Silicon-On-Insulator (SOI) type of substrate and including a fabrication sequence which is basically the same used for the bulk semiconductor substrate.

In addition, a method of manufacturing a semiconductor device including improved SiGe HCBT, according to further another aspect of the present invention, includes a fabrication sequence based on HCBT Bipolar transistor only process, using the same process steps of those used in Bipolar transistor technology.

A semiconductor device, according to another aspect of the present invention, includes a SiGe HCBT, comprising a collector electrode, a base electrode, and an emitter electrode, wherein the base region, processed on the sidewall of an n-hill layered structure layer, comprises a Silicon-Germanium alloy, grown at the sidewall and, also partially on top of said n-hill region.

According to a preferred embodiment, a semiconductor device according to an aspect of the present invention, includes SiGe HCBT, which is implemented in a single-polysilicon region with an ion-implanted n+ collector and which is configured to have the extrinsic base coincident with the grown base layered structure layer including Si/SiGe/Si stack on a portion of the top of the n-hill region.

According to said preferred embodiment, a semiconductor device according to an aspect of the present invention, includes a SiGe HCBT fabricated on a wafer plane, comprising a substrate of a first conductivity type; a collector region comprising an n-hill region, disposed on top of said substrate, comprising at least a first heavily doped or moderately doped layer and a second low doped layer forming a first metallurgical p-n junction with said substrate, said n-hill region having a base sidewall inclined at an acute angle to said wafer; one base region in form of layered structure layer disposed on a portion of said base sidewall of said n-hill region, forming a second metallurgical p-n junction and comprising a Silicon-Germanium alloy; an isolating layer disposed on a portion of base sidewall and a portion of said substrate; an emitter region disposed on said isolating layer, and forming a third metallurgical pn-junction with said base layered structure; Silicide electrodes contacting said collector, base and emitter regions and forming contact therein.

A semiconductor device, according to further another aspect of the present invention, includes two SiGe HCBTs, which are configured to have two active areas merged together at the opposite sides, each active area having an n-hill layered structure layers disposed in the proximity of each other, in such a way that two different base layered structure layers comprising a Silicon-Germanium alloy are formed on the sidewalls of said n-hill opposite regions and an emitter contact region is shared between the two HCBTs. Such structure has two collector contacts opposite to each other, two base contacts and a single emitter contact region.

Advantageously, the use of SiGe base in HCBT structure will result in improvements in its electrical characteristics and in particular, an increase in its cutoff frequency (fT) and maximum frequency of oscillations (fmax), as well as improvements in other important parameters. Simultaneously, the advantages of HCBT technology, such as low-cost fabrication process and possibility to adjust breakdown voltages without much addition to process complexity are still valid. Moreover, the compact HCBT structure with SiGe base layer offers advantages in comparison to the standard vertical-current SiGe HBTs in terms of reducing the parasitic parameters resulting in the potential further improvements in electrical characteristics.

BRIEF DESCRIPTION OF THE FIGURES

FIG. 9A and FIG. 9B show SiGe HCBT with p+ polysilicon extrinsic base: (FIG. 9A) with partially etched oxide under it possibly by undercut during emitter trench etching, and (FIG. 9B) with nitride layer between the p+ polysilicon and the n-hill.

FIG. 10 shows SiGe HCBT with p+ polysilicon extrinsic base with nitride layer between the p+ polysilicon and the n-hill and with the collector n+ region reaching the surface of the n-hill.

FIG. 11A and FIG. 11B show SiGe HCBT (FIG. 11A) with p+ extrinsic base in grown Si/SiGe/Si layer on silicon-on-insulator (SOI) substrate and (FIG. 11B) with double intrinsic base regions and double n-hill regions on SOI substrate.

FIG. 12 shows simulation results of the cutoff frequency (fT) and maximum frequency of oscillations (fmax) vs collector current (IC) of SiGe HBT and HCBTs with ideal extrinsic base doping shape (see FIG. 13A) and with realistic extrinsic base shape (see FIG. 13B). HCBT's emitter thickness is he=50 nm and extrinsic base width wbext=90 nm suitable for 55 nm lithography node.

DETAILED DESCRIPTION

Exemplary embodiments of the method of fabrication of a semiconductor device including improved SiGe HCBT according to the present invention are described herein.

First Embodiment

Figures from 1A to 1N show manufacturing steps of a method of manufacturing of the SiGe HCBT according to a first embodiment.

Figure 1A:
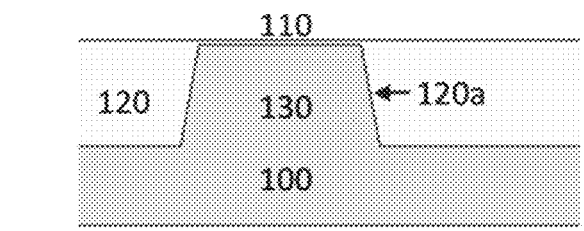
FIG. 1A to FIG. 1N show the fabrication sequence of SiGe HCBT with p+ extrinsic base in grown Si/SiGe/Si layer and partly in the n-hill region according to the first embodiment of the present invention.

In detail, FIG. 1A shows schematically a cross sectional view of a semiconductor wafer including a semiconductor substrate (100), for example a first conductivity type (or p-type) Silicon (Si) substrate and a Si active area (110) surrounded by insulating layer, for example a Silicon Oxide layer in the form of a Shallow Trench Isolation (STI) structure (120). SiGe HCBT is fabricated on the sidewall of the active area surrounded by the STI layer. STI is well known in the art and used in conventional CMOS processes. Therefore, the beginning of the SiGe HCBT fabrication is equivalent to the standard CMOS process steps required to obtain STI structure. The STI is configured to have a lateral sidewall (120a) forming an angle with the semiconductor wafer surface in the range 70-90 degrees, as a result of the Reactive Ion Etching (RIE) process used for defining it, said STI defining a region of the substrate active area where the collector doped region is placed, said region defining a "hill" region (130), having a top surface and a sidewall (120a), said "hill" region becoming an "n-hill" region after the n-type ion implantation in the semiconductor substrate (100), creating a p/n junction therein.

Figure 1B:
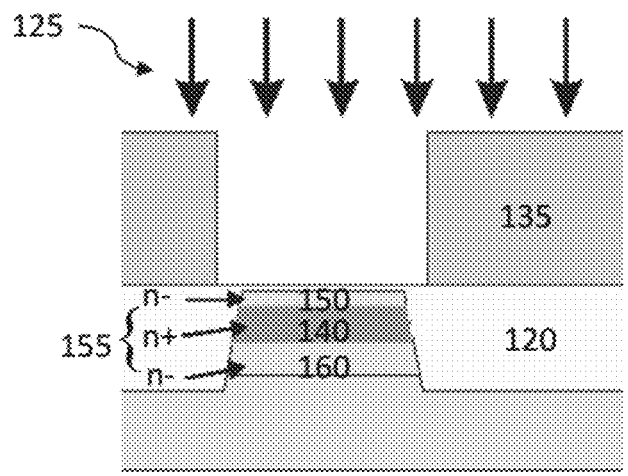

First an ion implantation (125) process is performed through a first mask (135) defining the formation of n+ collector region with the goal to create an n+ heavily doped collector layer with doping concentration above $10^{19}$ cm$^{-3}$. FIG. 1B shows the photoresist mask (135) used for the ion implantation (125) process step with an opening window in correspondence of the Silicon active area (110), and the n+ heavily doped collector layer (140) of the transistor.

According to another embodiment of the present method, such n+ heavily doped layer (140) is moderately doped with the concentration between $10^{16}$ and $10^{19}$ cm$^{-3}$, in the case the breakdown voltage of HCBT transistor needs to be increased. The depth of the intrinsic transistor depends on the particular process parameters, comprising the STI structure depth, the targeted high frequency performance, the targeted current, the process controllability, and preferred value of depth are between 50 nm and 100 nm.

On top of the n-hill region (130) formed in the active area surrounded by the insulating STI layer (120), a low-doped collector (n−) region (150) is formed in order to decrease the collector concentration near the highly doped extrinsic base, which will be formed later in the process. The preferred thickness of the top n− region (150) is 50 nm, but it may be larger or smaller depending on the target performance and other process parameters. Another low doped n− region (160) is also formed toward the p-substrate, below said n+ heavily doped layer (140).

According to another embodiment of the present invention, the n− region (150) at the top is grown by selective epitaxial growth. As a consequence, the n-hill is completely n+ doped and the transition toward n− region becomes sharper which could be beneficial for transistor's electrical characteristics optimization.

Figure 4:
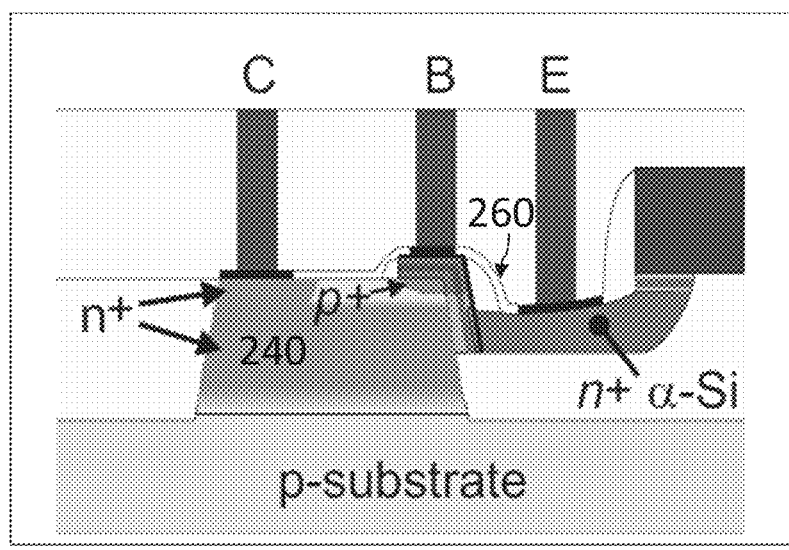
FIG. 4 shows SiGe HCBT with p+ extrinsic base in grown Si/SiGe/Si layer according to the first embodiment of the present invention, with deeper n+ collector region.

According to still another embodiment of the present invention, as depicted in FIG. 4, the lower doped n− region (160) is not formed and the n+ region (140) extends deeper toward the substrate, including the portion previously occupied by the bottom n− region (160) in order to decrease the collector resistance and enhance the collector current spreading, reducing the base widening or Kirk effect.

All the above layers (140, 150, 160) form the n-hill layered structure layer (155), which are configured to optimize the collector doping profile for targeted transistor performance.

According to an embodiment, the n-hill region is formed by using the ion implantation steps which are in use in the standard CMOS process technology, like the standard CMOS "n-well" implantation process steps. In this case, the first HCBT mask (135) can be replaced by the standard n-well CMOS mask, simplifying the HCBT integration with CMOS and reducing the fabrication cost.

In contrast to the pure Silicon HCBT, where n-hill is moderately doped by implantation dose between $10^{16}$ and $10^{19}$ cm$^{-3}$, according to the present method a higher doping is used in the SiGe HCBT implantation process in order to improve the fT and fmax and the low doped collector layer is grown by epitaxy at the sidewall of n-hill. However, lower-doped n-hills are also suitable for SiGe HCBT, especially for transistors with higher breakdown voltages.

After the n-hill implantations of HCBT, or n-well implantations as in standard CMOS technology, a gate stack is formed like in CMOS process flow. A dummy polysilicon gate (170) is formed over the STI insulating structure (120) in the vicinity of the active HCBT n-hill layered structure layer (155), said dummy gate having the purpose of obtaining a preferential shape for the emitter n+ region, which will be formed in the next steps and which will be made by amorphous, or polycrystalline, or crystalline Si material, or other material, as usually made in the implanted-base pure silicon HCBT process flow.

Figure 1C:
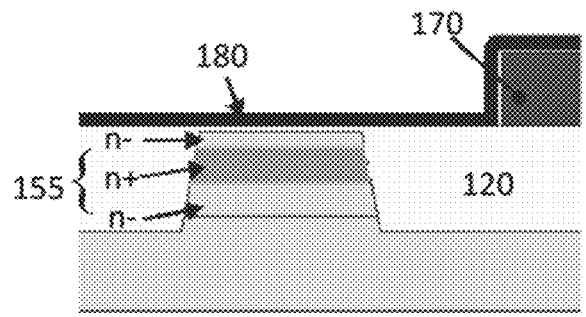

Next, a nitride layer (180) is deposited over the entire wafer, as shown in FIG. 1C.

Figure 1D:
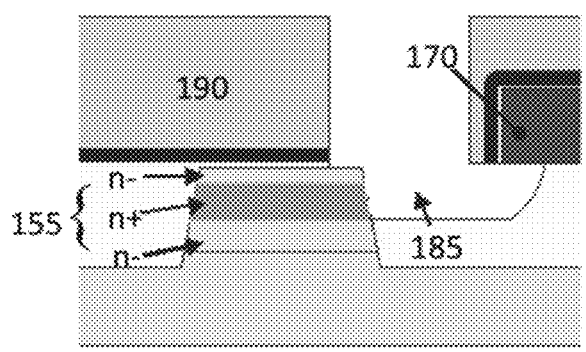

The following step uses a second HCBT photoresist mask (190) (or a first one in the case the mask for n-hill implantation is omitted), which is used to define the window for the emitter trench (185) etching process (FIG. 1D). The deposited nitride layer (180) is first etched, either isotropically or anisotropically, and then followed by timed oxide etching process, partially removing the STI insulating material (120) and forming the emitter trench (185), exposing the sidewall of the n-hill layered structure layer (155) and defining the active transistor position.

Figure 1E:
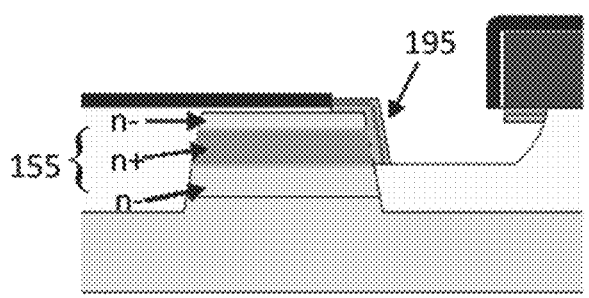

After removing the photoresist, base layered structure layer, for example Si/SiGe/Si layer stack (195), is grown by selective epitaxial growth (FIG. 1E). By using the selective epitaxial growth, the desired layer stack is grown on the exposed Silicon surfaces, by following the Silicon crystal orientation, for example on the n-hill sidewall for creating the intrinsic base of the transistor, and on the exposed top part of the n-hill for creating the extrinsic base of the transistor. The Si/SiGe/Si layer stack (195) is eventually formed on the exposed bottom part of the dummy gate (as shown in FIG. 1E), which doesn't have any effect on the device electrical function. An example of Si/SiGe/Si layer stack (195) is shown in FIG. 2, where the net impurity concentration (cm$^{-3}$) and the Germanium Mole Fraction profiles with the distance (nm) inside an angled Silicon surface is depicted.

Figure 2:
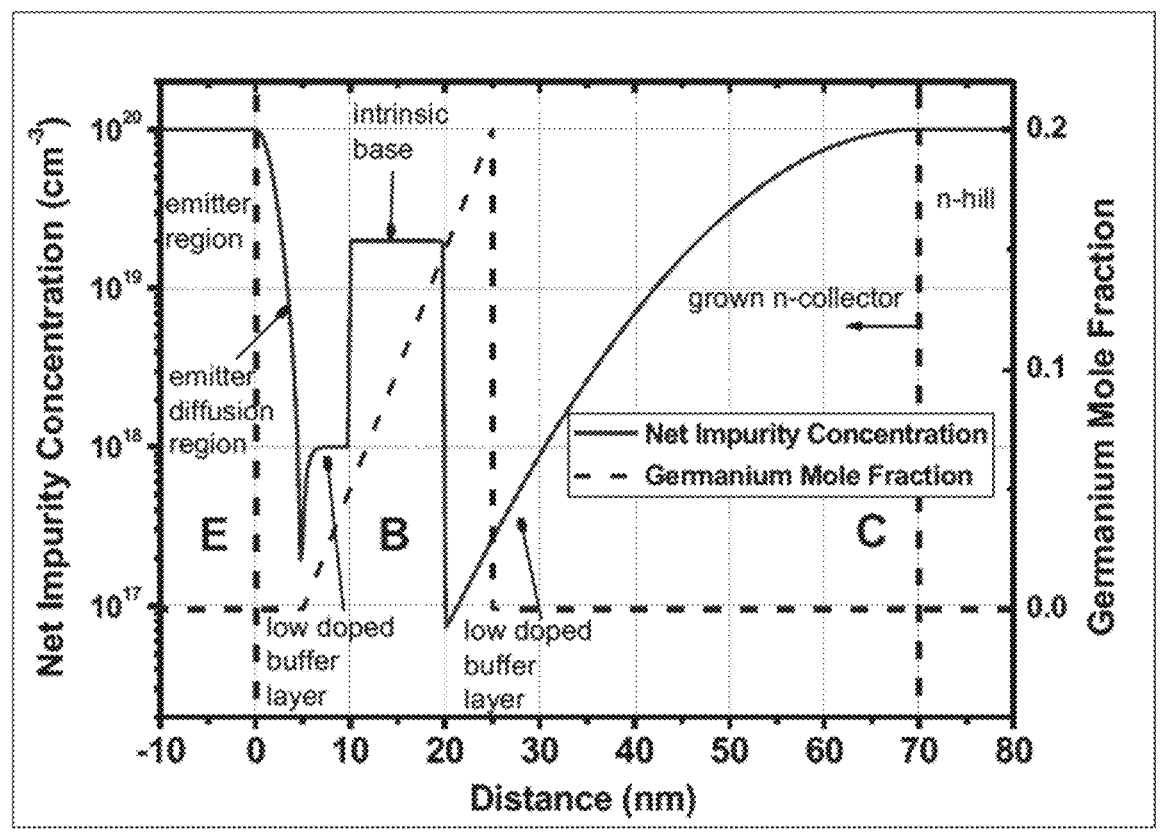
FIG. 2 shows the doping profile of the grown base layered structure layer (left axis) and the Germanium graded profile (right axis).

As shown in FIG. 2 proceeding from the right to the left, according to preferred embodiment of the present invention, a typical grown layer stack includes: low-doped n-collector buffer layer, with the aim of reducing the electric field in the collector-base depletion region and of obtaining the target breakdown voltage; heavily doped or moderately doped p+ base region (intrinsic base); low-doped emitter buffer layer, where the n+ emitter will diffuse into. According to a preferred embodiment, SiGe alloy layer with carbon is used in the base region (as shown by the dotted line in FIG. 2), but it can protrude into emitter and collector as well, particularly into the low doped regions towards the collector. Various profiles of SiGe layer are used, with graded layer as the one shown in FIG. 2. The preferred base doping level is about $10^{19}$ cm$^{-3}$ or above and the thickness is less than 10 nm. The aforementioned grown layer stack (195) forms the so-called "base layered structure layer", as we will call it below.

Figure 1F:
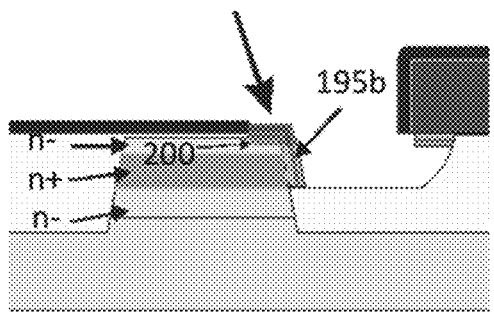
Figure 3:
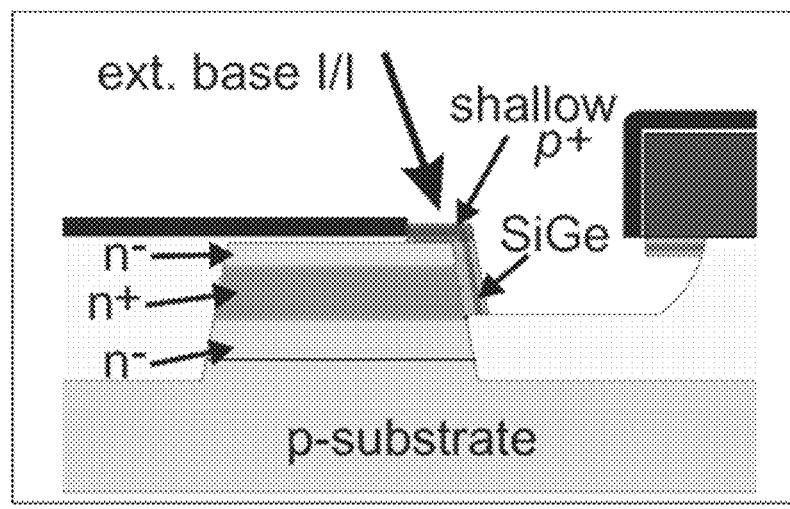
FIG. 3 shows the structure of SiGe HCBT with p+ extrinsic base in grown Si/SiGe/Si layer, according to the first embodiment of the present invention, with shallower p+ extrinsic base region, in this case shallower than grown Si/SiGe/Si layer.

Next, as shown in FIG. 1F, the implantation process step of the base contact region (200), which is also known in the art as the "extrinsic base region", is performed. This implantation is made next to an angle greater than the angle of the n-hill (155) sidewall to protect the "intrinsic" base sidewall (195b) from additional doping. The Nitride layer (180) is used as an implantation mask to protect all other transistor regions from the implantation; appropriate Nitride thickness is chosen to be suitable for this masking purpose. A heavily implantation dose around $10^{20}$ cm$^{-3}$ is targeted for this extrinsic base region (200), with the junction depth extending a little deeper than the base layered structure layer (195) grown on a portion of said n-hill layered structure layer (155). In this way, the base layered structure layer (195) will receive p+ doping on its top portion, compensating the n− doping and resulting in the formation of a doped region which total charge is 0. In this way any possible defects or dislocations caused by epitaxial growth at the sharp corner of the top of the sidewall will not be the cause of leakage currents, since it is placed in a neutral p+ region. According to a particular embodiment, where the grown layer exhibits a concentration of defects and/or dislocations low enough not to increase the leakage current, the extrinsic base p+ implantation can be made shallower, as shown in FIG. 3.

In the next step, as successfully already used in the implanted-base pure-Silicon HCBT process, a Thermal Annealing is performed to form the "protection" layer (210) at the top of the grown base layered structure layer (195). Such thin "protecting" layer (210) will protect the grown stack during the etching process of the n+ emitter layer and, on the other hand, will not increase the series resistance considerably and will not impact the electrical characteristics of the device, by reducing current, gain or degrading the noise. The protection layer (210) is chosen as one of the following possible materials, comprising: Oxide, Nitride, Oxynitride or any other material or layered materials that satisfies the above requirements.

Figure 1G:
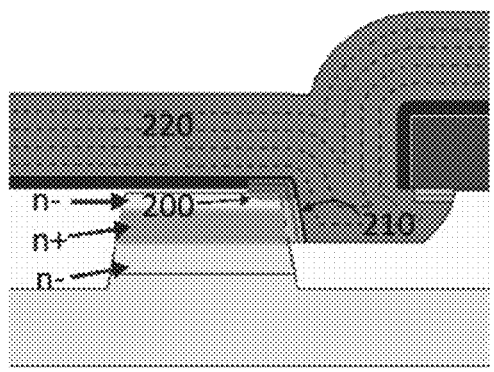
Figure 1H:
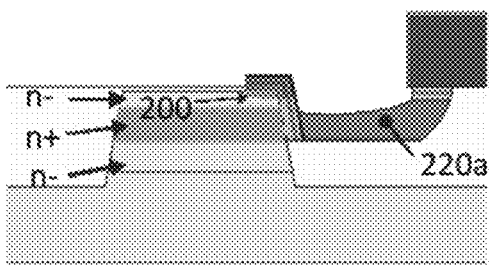

Next, an in-situ doped n+ amorphous Silicon (α-Si) layer (220) is deposited to fill the emitter trench, as shown in FIG. 1G. After the deposition the (α-Si) layer is etched so that the excess material above the emitter trench (185) is completely removed and the residual material (220a) will fill the emitter trench only (FIG. 1H). The final thickness of the n+α-Si layer (220a) determines the active emitter area and has to be aligned with the n+ collector region (140) in the n-hill. The etching process is made by using an etchant selective to the protection layer (210), as, for example, the Tetramethyl Ammonium Hydroxide (TMAH).

According to another embodiment, the etchant is selective to high p+ doping of the base region or to the Ge material, thus the protection layer does not need to be grown and the grown stack will be protected either by high p+ doping or by Germanium itself.

The rest of the structure, including the CMOS transistors, is covered by the Nitride layer (180) and protected during (α-Si) layer etching.

The n+ emitter layer (220a) is configured to fill the emitter trench completely and provide its top surface without dimples, in such a way to obtain a flat n+ layer after etching, which forms the emitter contact region, as shown in FIG. 1H. Moreover, the deposited n+ emitter layer (220a) provides the dopant source for the emitter diffusion into the grown base layered structure layer (195), with low resistance. The amorphous Si layer provides smooth surface and homogeneous etching rate. According to another embodiment polycrystalline or crystalline Si material can be used as well for emitter n+ region.

Figure 1I:
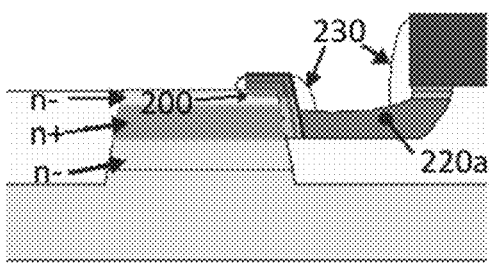

The process steps dedicated to the fabrication of the SiGe HCBT transistor are completed and the remaining steps used to complete the device formation are taken from the standard CMOS technology. For example, oxide spacers (230) formed at the sidewalls of the dummy gates uses the same process steps used in the formation of the spacer in CMOS technology. The same steps are also used to form the spacer oxide at both sidewall sides of the base layered structure layer (195), above n+ emitter region (220a) and above the n-hill (155), as shown in FIG. 1I.

Figure 1J:
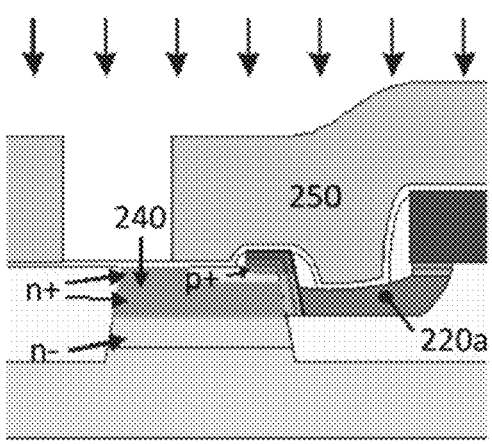

The n+ collector contact region (240) is fabricated by source/drain ion implantation of n-channel MOSFET using the same mask (250) as in CMOS process (FIG. 1J). The implanted n+ collector contact region (240) should be deep enough to reach and merge with the heavily doped n+ collector region (140) implanted by using the first HCBT mask.

Figure 1K:
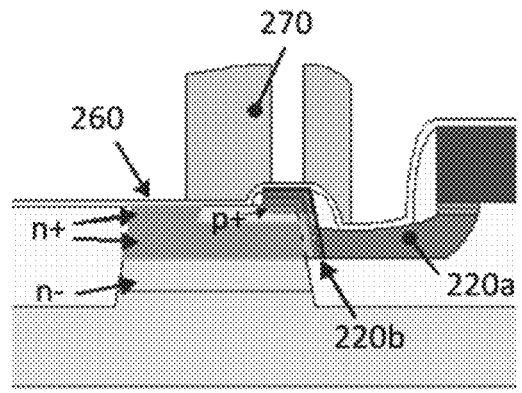

The annealing step used in CMOS process for the activation of source/drain and other ion implantation steps is also used in HCBT to activate the extrinsic base (200) and the n+ collector contact implantations (240), as well as to generate the diffusion of emitter dopants (220b) from the n+ emitter layer (220a) into the base layered structure layer (195), as shown in FIG. 1K.

Figure 1L:
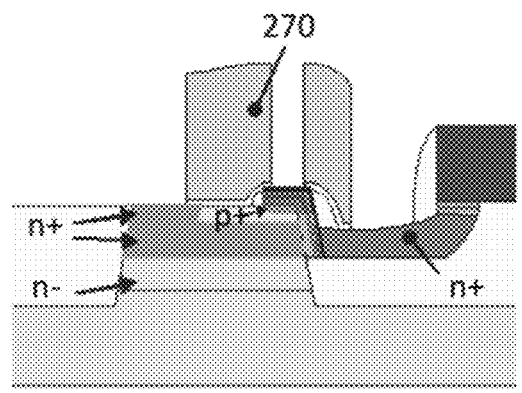
Figure 1M:
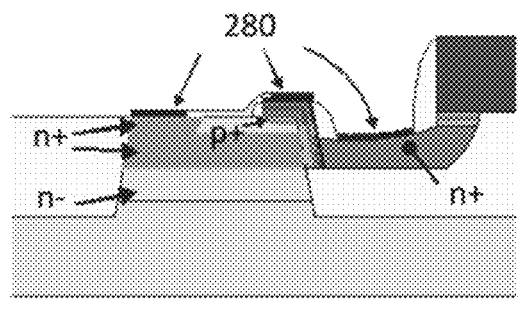

Next, a Silicide blocking oxide (260) is first deposited over the entire wafer surface (FIG. 1K) to avoid the Silicide formation in some regions and then removed from other areas (FIG. 1L) to expose the Si surfaces to subsequent silicidation (280) of the selected areas by means of a Silicide mask (270) taken from CMOS and then applied to HCBT (FIG. 1M). According to a preferred embodiment the silicide blocking oxide (260) is kept between collector and base contacts as well as between emitter and base contacts as shown in FIG. 1L. According to another embodiment, the silicide blocking oxide is kept only between collector and base contacts as shown in FIG. 1M, after the silicidation step (280). By removing silicide blocking oxide (260) between base and emitter contacts, Silicides (280) are separated by oxide spacer N and are self-aligned to each other. However, if Silicides (280) are too close to the intrinsic transistor region, they can cause base current increase and current gain reduction. In that case, the blocking oxide (260) is preferably left between the emitter and base regions (see for example FIG. 4) to enhance the separation between them.

Collector (C), emitter (E) and base (B) metal contacts (290) are made together with CMOS metal contacts using CMOS process steps. A base contact region is a part of the base layered structure layer (195) on which the base silicide (280) is placed, which is equivalent to the extrinsic base region. A base contact region can also penetrate into the top portion of the n-hill (155) and then comprises the portion of the base layered structure layer on the top of the n-hill (155), the portion of the base layered structure layer at the sidewall of the n-hill and the portion of the n-hill (155). The emitter contact region is the n+ polysilicon layer (220a) on which the emitter silicide is placed while the collector contact region is the implanted n+ region on which emitter silicide is also placed.

Figure 1N:
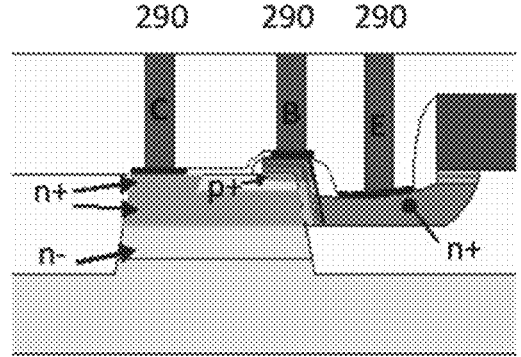

The final SiGe HCBT structure is shown in FIG. 1N. An example of the final SiGe HCBT structure with deeper n+ collector region (440) and the silicide blocking oxide left between the base and emitter contacts (460) is shown in the cross-sectional view of FIG. 4.

Second Embodiment

The second embodiment is obtainable from the first embodiment by only few modifications of the fabrication steps, as specified in claims 3 to 6.

Figure 5A:
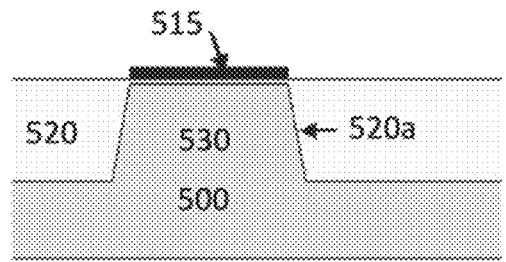
FIG. 5A to FIG. 5H show fabrication sequence of SiGe HCBT with SiGe intrinsic base grown only on the n-hill sidewall according to the second embodiment of the present invention.
Figure 5B:
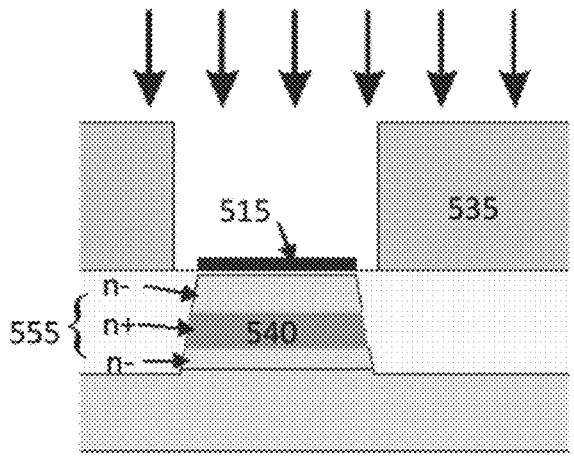

According to a second embodiment, a layer stack composed by Silicon Oxide layer and Silicon Nitride layer (515), is deposited on the entire substrate surface, said Nitride layer (515), which is used to define the active areas in CMOS STI process, being kept above HCBT active region (FIG. 5A). This added etching step requires additional lithographic mask (not showed here) in order to leave said Nitride layer (515) above the n-hill region (530) of the HCBT and removing it by etch from above CMOS active areas. In this case the collector implantation mask (535) is the second mask used in the HCBT fabrication process. In this way the collector heavily or moderately doped layer (540) is ion implanted through the Nitride layer (515) in the same way as in the first embodiment, but possibly deeper into the n-hill layered structure layer (555), as shown in FIG. 5B.

Figure 5C:
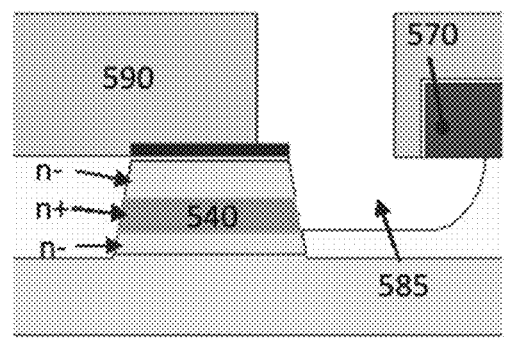

Emitter trench is also etched in a similar way as in the first embodiment, with dummy polysilicon gate (570) placed near the n-hill region (530), but also extending deeper into the STI structure (520), as shown in FIG. 5C.

Figure 5D:
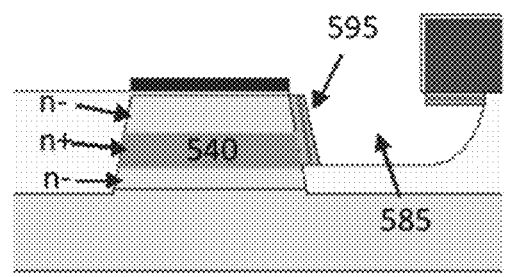

By keeping the Nitride above the n-hill region (530) covering the active area surface, only the sidewall of the n-hill region (530) is exposed to the selective epitaxial process step, so that the base layered structure layer (595) including Si/SiGe/Si stack is grown only on the sidewall of the n-hill and not on top of it as in the first embodiment (FIG. 5D).

After the selective epitaxial growing process, the Nitride layer (515) is removed from the top surface of the n-hill region (530).

Figure 5E:
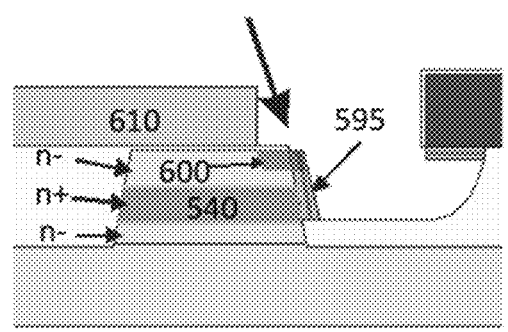

Next, the extrinsic base, forming the base contact region (600), is angle-implanted in order to protect the base layered structure layer (595) including Si/SiGe/Si stack. The photoresist mask (610) covers the collector part of the transistor, as well as CMOS regions (FIG. 5E). This is the third HCBT mask of the process flow according to the second embodiment.

As explained in the foregoing, according to the second embodiment, the base layered structure layer (595) including Si/SiGe/Si stack is grown only at the n-hill region sidewall, avoiding the corner at the top of the n-hill region (530), as this is a possible source of defects and/or dislocations. The extrinsic base (600) is implanted in the top part of the n-hill layered structure layer (555) extending laterally, having electrical contact with the grown base layered structure layer (595) including Si/SiGe/Si stack.

Figure 5F:
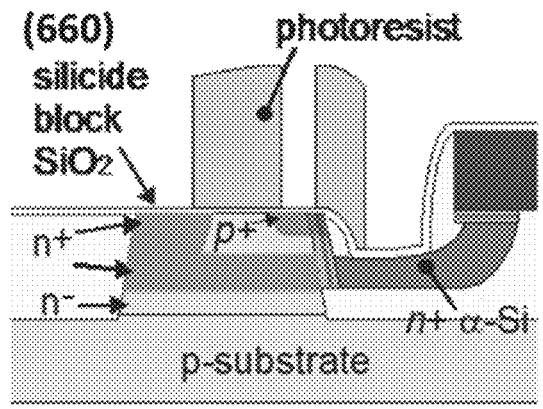
Figure 5G:
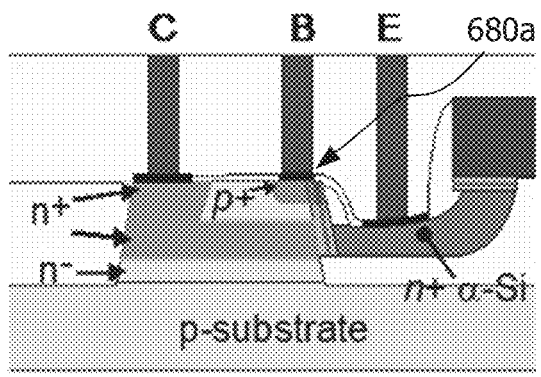
Figure 5H:
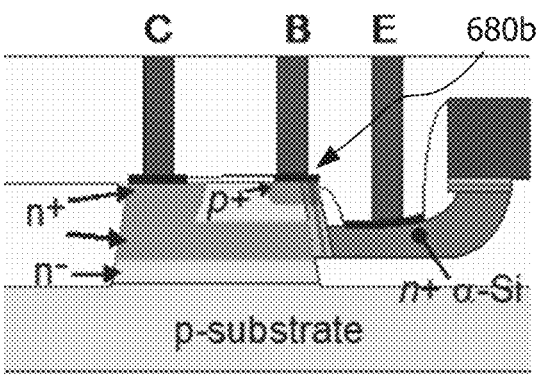

A base contact region is a part of the base layered structure layer (595) on which the base silicide is placed, which is equivalent to the extrinsic base region. To do this, a layer of silicide blocking oxide (660) is firstly deposited between the base and emitter regions (FIG. 5F), so that the base silicide layer (680a) is formed only on the top portion of the n-hill region (530) (see zoom in of FIG. 5G). Alternatively, if the silicide blocking layer is not placed between the base and emitter (FIG. 5H), but they are separated by the sidewall spacer in between, the base silicide (680b) also comprises a top part of base layered structure layer (595), beside a top portion of the n-hill region (555) (see zoomed in portion of FIG. 5H).

In the second embodiment, the extrinsic base (600) is not shifted upwards by the grown layer as in the first embodiment and this is the reason why the intrinsic transistor region is made deeper. The rest of the process is made basically in the same way as in the first embodiment.

Third Embodiment

The third embodiment is obtainable from the first embodiment by modifying the method of manufacturing described in claim 1 in such a way to build together two HCBT structures, as specified in claims 7 to 12.

Figure 6A:
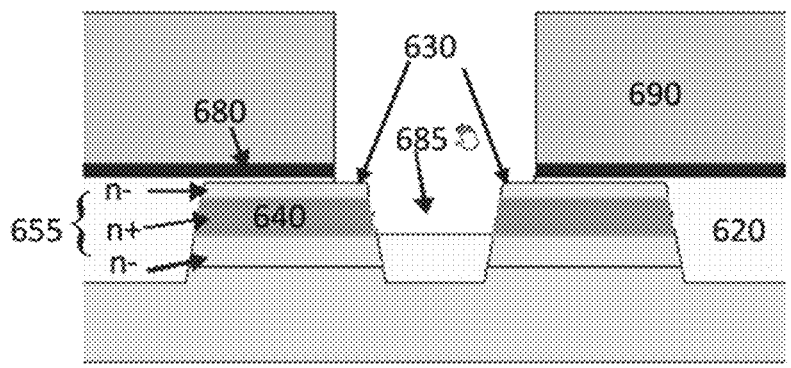
FIG. 6A to FIG. 6P show the fabrication sequence of SiGe HCBT with double intrinsic base regions and double n-hill regions according to the third embodiment of the present invention.

According to a third embodiment, two active "hill" regions (630) are disposed in the proximity of each other and the CMOS dummy gate, which has been used for shaping the deposited n+ emitter region in the previous embodiments, is not needed anymore, hence is not shown in FIG. 6A.

The process starts as in the first embodiment with the implant of the heavily (or moderately) doped n+ collector region (640), the deposition of the Nitride layer (680) and the etch of the emitter trench (685) by the second HCBT mask (690) (FIG. 6A).

Figure 6B:
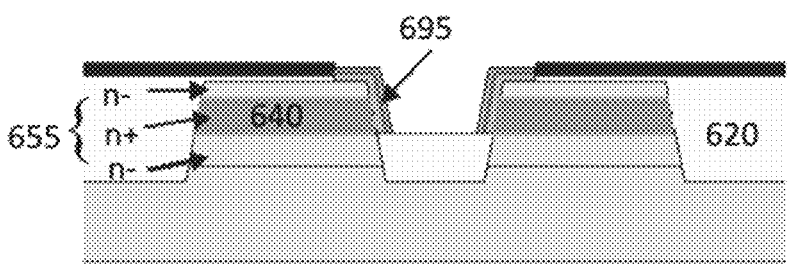

The exposed base sidewalls of the n-hill regions (630) are opposite to each other and base layered structure layer including Si/SiGe/Si stack (695) is selectively grown on them as shown in FIG. 6B.

Figure 6C:
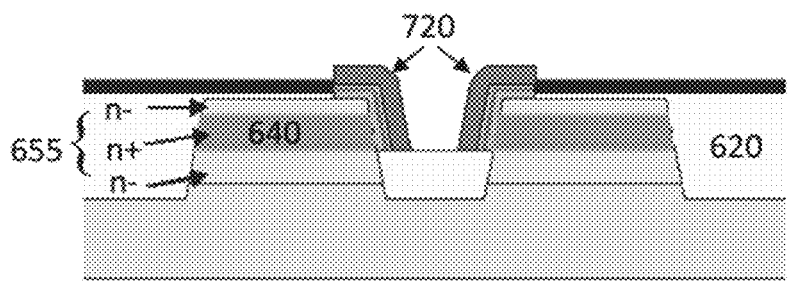
Figure 6D:
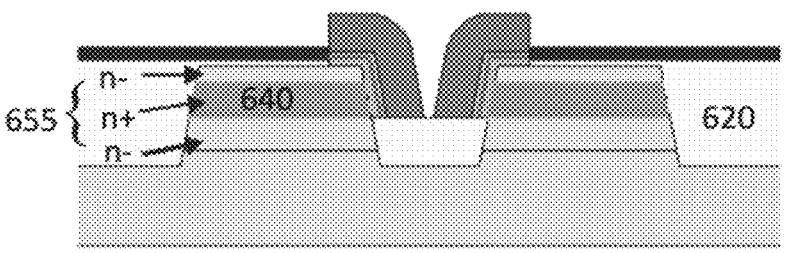
Figure 6E:
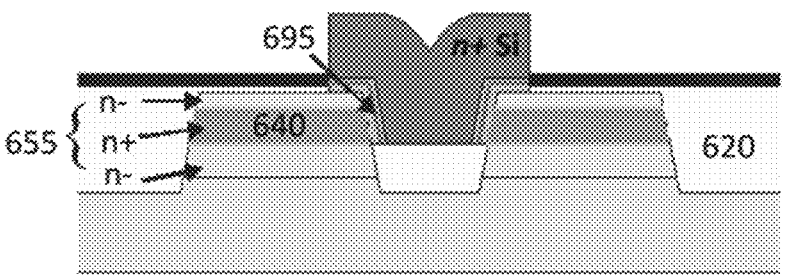

After emitter low-doped buffer layer, the growth continues with the formation of the n+ emitter region (720), which is made of crystalline (i.e., monocrystalline) Si layer continuing the crystal orientation of the n-hill layer structure layers (655) and of the grown base layered structure layer including Si/SiGe/Si stack (695). The growing progress is illustrated from FIG. 6C to FIG. 6E. Crystalline emitter material offer the advantage of a reduced emitter resistance. The grown n+Si layer fills the emitter trench between the active n-hill regions.

Figure 6F:
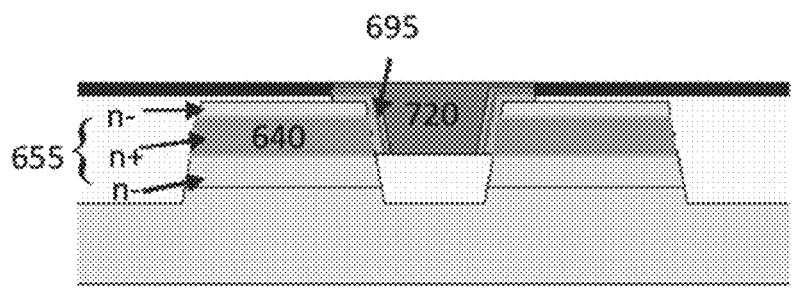

Next, the grown n+ emitter region is planarized by using Chemical Mechanical Polishing (CMP) step, removing excess material protruding from the surface of the emitter trench and flattening its surface, as shown in FIG. 6F.

Figure 6G:
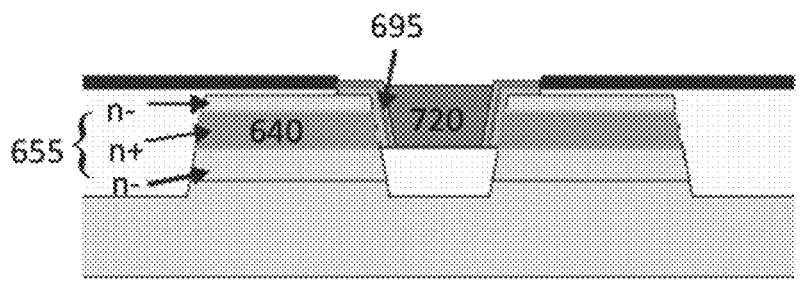

Preferentially, the n+ emitter region (720) is etched a little to expose the base layered structure layer including Si/SiGe/Si stack (695) on the portion of the top of the base layered structure layers (695) (FIG. 6G). In an embodiment etchant which is selective to the p+ region, such as TMAH, is employed; in another embodiment etchant with low Germanium etch rate is employed.

Figure 6H:
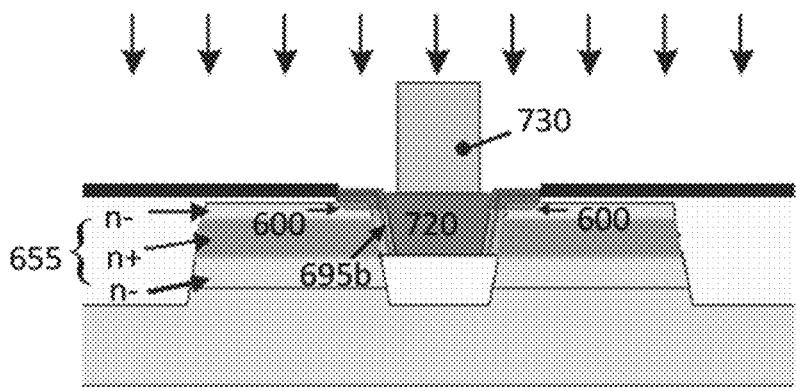

The middle part of the n+ emitter region (720) is than covered with the third HCBT mask (730) and the extrinsic base (600) is exposed to p-type ion implantation (FIG. 6H). Photoresist protects the n+ region from p+ doping, in such a way that in the next etch step of the n+ emitter region (FIG. 6I) an etchant with higher selectivity to p-type doping is used.

Figure 6I:
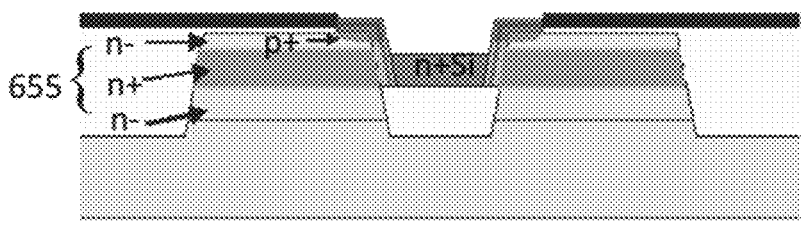

After the extrinsic base implantation, the n+ emitter region (720) is timed etched to a predetermined thickness and the active transistor height is defined (FIG. 6I).

Note that the third HCBT mask (730) can be eliminated in the case the activated extrinsic base (600) p-type doping is lower than the emitter (720) n-type doping, not affecting the emitter etching. In this case, the extrinsic base (600) is implanted in the whole n+ emitter (720) surface, but it does not stop the etching. The doping of the extrinsic base (600) on a portion of said top surface of said n-hill layered structure layers (655) becomes the dominant doping and protects it from the etching. Alternatively, an etchant that does not etch Germanium (or Carbon) can be used instead, and the third mask (730) can be eliminated, as well. In this case, the etching stop is the Si/SiGe/Si stack (695) grown on top of a portion of the n-hill region surface and the process used to expose extrinsic base (600) region (FIG. 6G) is needed to make sure that n+ emitter material is completely removed above it, exposing the Si/SiGe/Si stack underneath.

Note also that, in the case the thickness of the nitride layer (680) is lower than base layered structure layer (695) with Si/SiGe/Si grown stack, the n+ emitter region (720) is removed by CMP, extrinsic base (600) will be exposed and the over etch step showed in FIG. 6G can be eliminated.

It has to be noted that, in the case the p+ extrinsic base (600) is used as stopping layer during the etching step of the n+ emitter region (720), the activation step of said p+ implanted extrinsic base (600) must be added to the process flow, after the implantation step. This depends on the doping of the intrinsic base (695b), the characteristics of the used etchant and parameters of the extrinsic base (600) implantation, the level of n+ emitter doping etc.

It has to be noted that the CMP step is not necessary to obtain the final n+ emitter region (720). Since the n+ emitter region fills the emitter trench when the growth from the opposite sides merge together, the n+ etching step can be used directly and n+ region will remain at the bottom of the trench in the case the grown thickness is at least half of the distance between the n-hills. Note also that the use of CMP may be limited by the existence at any process step of CMOS transistor gates higher than HCBT transistor; in any case CMP is beneficial to improve the controllability of the process and requires thinner n+ emitter layer to be grown.

Figure 6J:
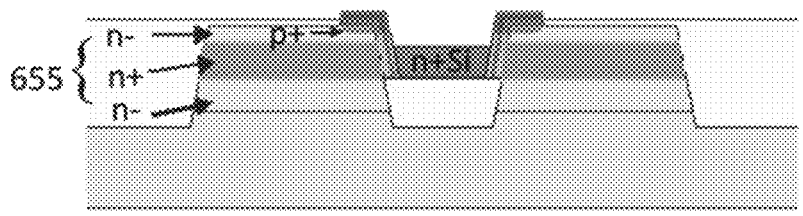
Figure 6K:
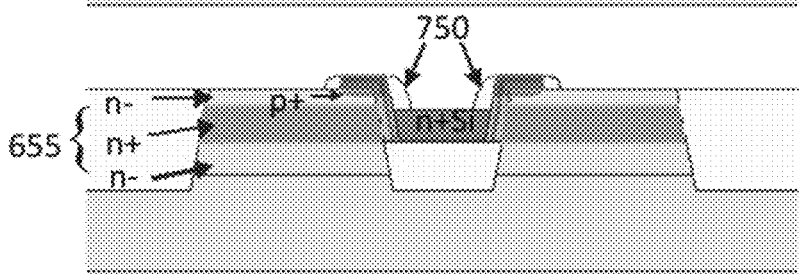
Figure 6L:
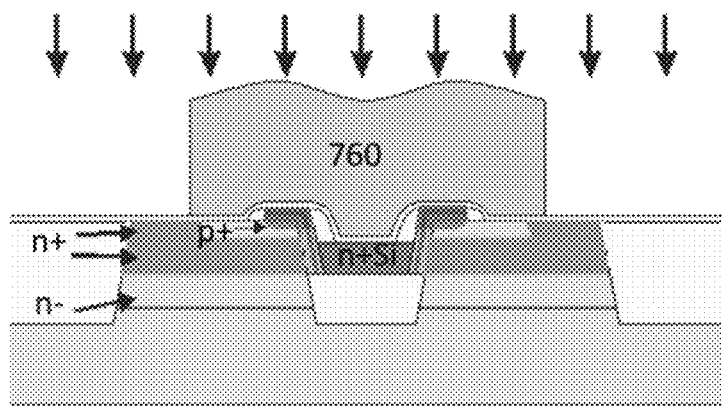
Figure 6M:
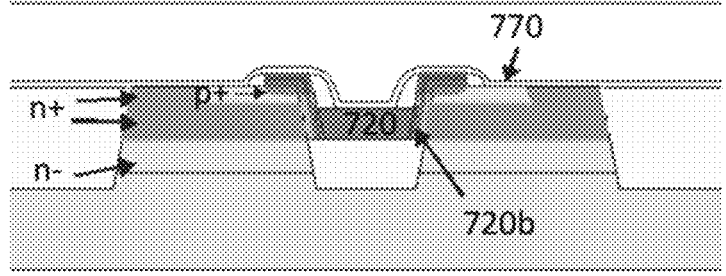
Figure 6N:
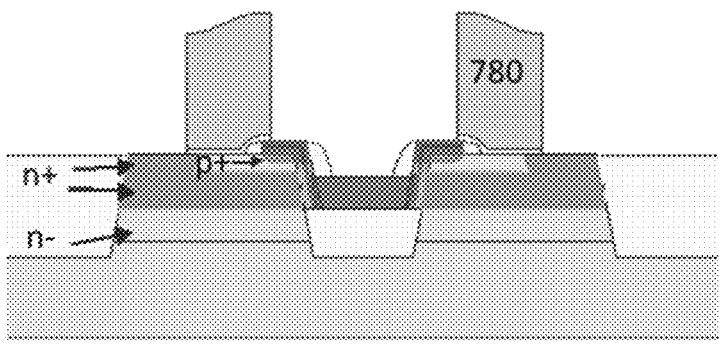

The rest of the process is basically the same as in the first embodiment, including the etching of Nitride (680) (FIG. 6J), the formation step of the spacers (750) (FIG. 6K), the n-type ion implantation of the n+ collector contact region (FIG. 6L), the deposition of the silicide blocking oxide (770) (FIG. 6M) and the etch of the silicide blocking oxide (770) outside the region between the base and the emitter, as shown in FIG. 6N, by using the lithographic mask 780.

Figure 6O:
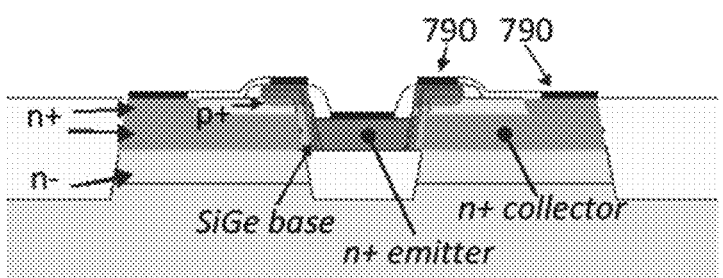
Figure 6P:
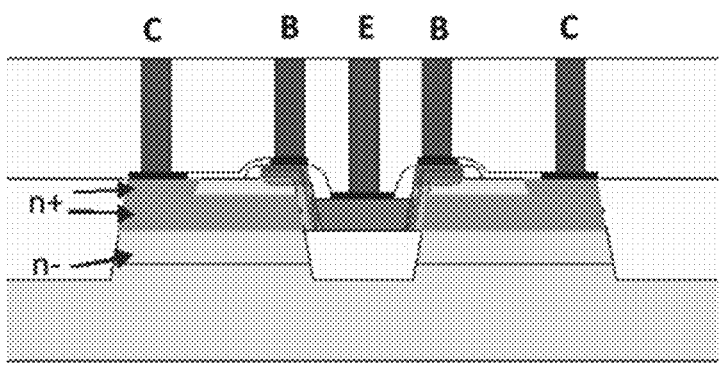

The fabrication is terminated with the Silicide (790) formation (FIG. 6O) on the contact regions and the metal contact formation (FIG. 6P). The same definition of the first embodiment is valid for the base (B), emitter (E), collector (C) contacts of the correspondent metal contact regions, but according to the third embodiment, the final device structure comprises two base and two collector contacts, as they are implemented in two different n-hill regions.

Preferentially, according to the third embodiment, the SiGe HCBT structure makes it possible to grow the whole intrinsic transistor stack, for example the base layered structure layer (695) including Si/SiGe/Si stack together with n+ emitter layer (720) in only one batch in the same furnace, resulting in a reduced series resistance and in a simplification of the technology.

Note also that the same concept used in the first embodiment with protection layer (210) and the deposition of n+ amorphous silicon layer (220) or similar, is also applicable in the third embodiment.

Similarly, the growth of n+ emitter region (720) just after the base layered structure layer (695) including Si/SiGe/Si stack can be used in the first and the second embodiments, such that it fills the emitter trench completely to obtain the flat deposited surface which will translate into the flat final emitter surface after the n+ region timed etching.

The final SiGe HCBT structure does not have either polysilicon emitter or polysilicon base layers as is the case in almost every modern vertical-current SiGe HBT, resulting in a reduced emitter and base series resistances, which is cause of the limitation of their performance. According to the three embodiments so far described, SiGe HCBT can circumvent said limitations, improving transistor characteristics in comparison to the vertical-current SiGe HBTs.

Fourth Embodiment

The fourth embodiment is obtainable from the first embodiment by only few modifications of the fabrication steps, as specified in claims 13 to 17.

FIG. 7 shows the fabrication steps according to a fourth embodiment.

Figure 7A:
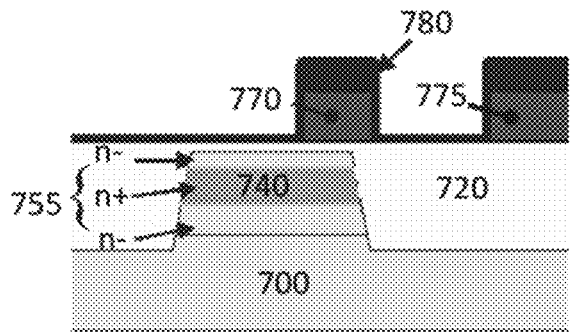
FIG. 7A to FIG. 7K show the fabrication sequence of SiGe HCBT with p+ polysilicon extrinsic base according to the fourth embodiment of the present invention.

After the n+ heavily (or moderately) doped collector region (740) formation, as in the first embodiment, the p+ polysilicon gate, which is used as polysilicon extrinsic base region (770) is formed above the n-hill layered structure layer (755), partially overlapping the isolating oxide structure (720), as shown in FIG. 7A. Another p+ dummy polysilicon gate (775) is formed on the emitter trench, at the opposite side. Note that the p+ polysilicon gate (770) from CMOS process can be used or an additional p+ polysilicon layer can be used, as well, in case the first is not available.

Figure 7B:
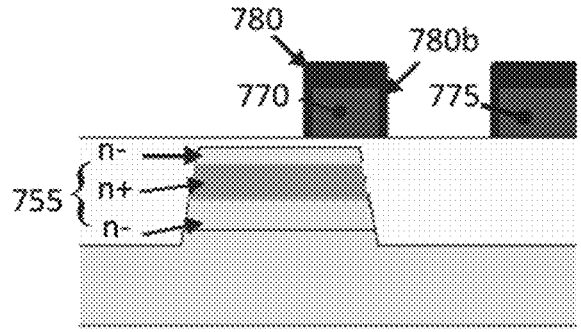

As shown in FIG. 7A, after the p+ polysilicon layer (770), additional layer of Nitride (780) is deposited on top of the structures. After this, another Nitride layer (780) is conformally deposited by Chemical Vapor Deposition (CVD) or similar process, to encapsulate the p+ polysilicon layers (770). The Nitride (780) is anisotropically etched to form the Spacer Nitride (780b) at the sidewalls of the p+ polysilicon (770) (FIG. 7B).

Figure 7C:
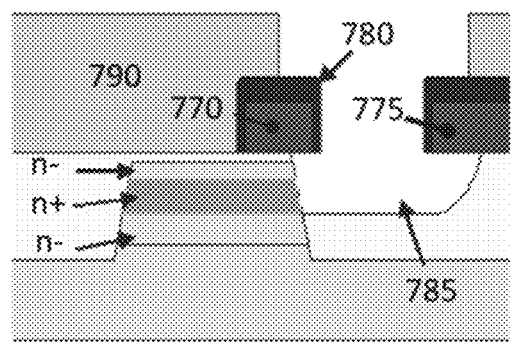

Next, the photolithographic mask (790) is used to define the window for the emitter trench etching process and to protect the other parts of the device (FIG. 7C). The photoresist mask opens a window between two polysilicon gates (770), defining the emitter length, for example in the direction normal to the plane of the cross-section, not shown in FIG. 7C.

Figure 7D:
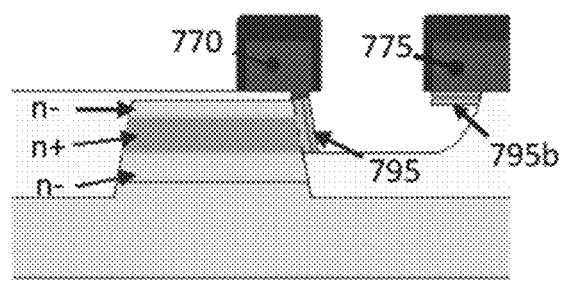

Next, the base layered structure layer (795) including Si/SiGe/Si stack is grown at the exposed base sidewall and at the bottom of p+ polysilicon gate (770). The growth starts from the bottom of p+ polysilicon extrinsic base region (770), as shown in FIG. 7D on the left side, and the portion extending from the bottom of the gate merges with the growth at base sidewall.

Note that, in the fourth embodiment the p+ polysilicon extrinsic base region (770) above the n-hill region (755) is used as a base contact region and, for this reason, the extrinsic base ion implantations can be eliminated in this embodiment. Since the implanted p+ extrinsic base region, for example in the case of the first embodiment, protrudes into the collector, it increases the collector-base capacitance. If p+ polysilicon (770) is used to contact the intrinsic SiGe base region, the oxide layer is left between the p+ polysilicon extrinsic base region (770) and the n-hill region (755) reducing collector-base capacitance. The nitride layers (780) protect the growth from the other surfaces of the p+ polysilicon extrinsic base region.

Figure 7E:
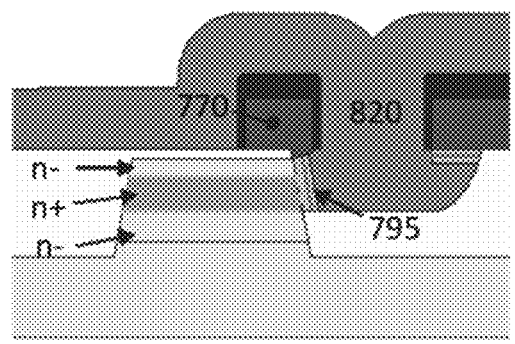
Figure 7F:
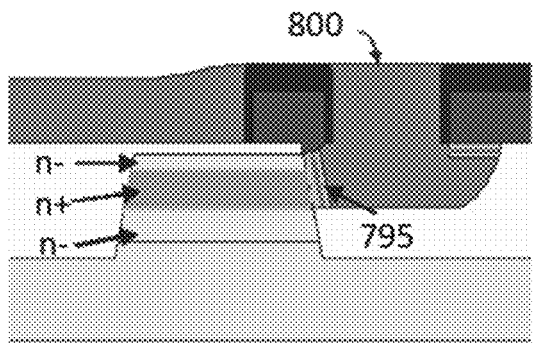
Figure 7G:
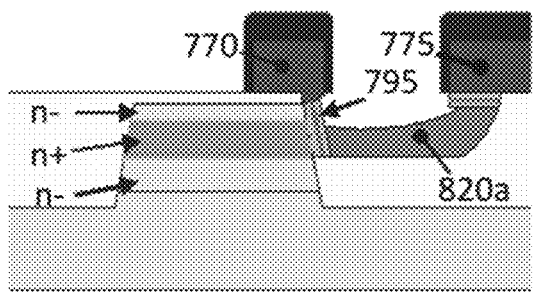
Figure 7H:
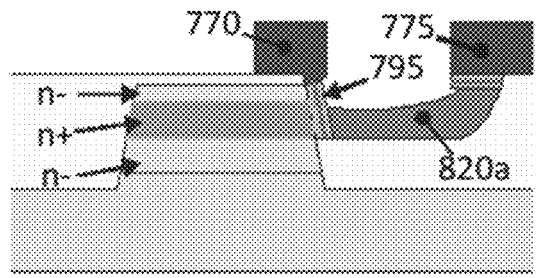
Figure 7I:
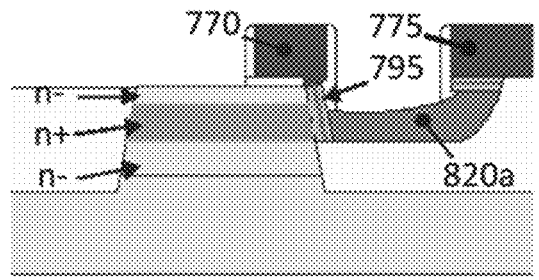
Figure 7J:
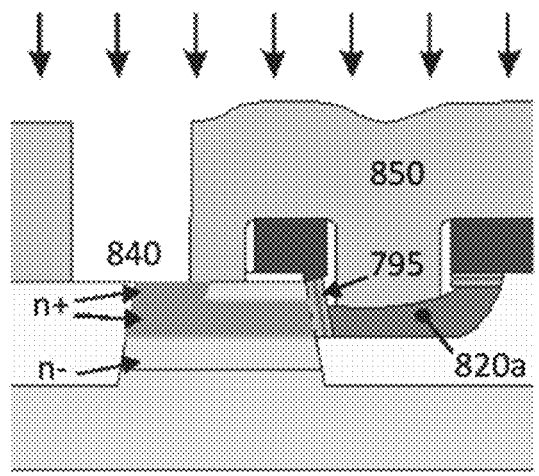

Next, the n+ emitter layer (820), made for example of amorphous Silicon, or polycrystalline, or crystalline material, is deposited to fill the emitter trench (785), as shown in FIG. 7E. After, the deposited n+ emitter layer (820) is planarized by Chemically-Mechanically Polishing (CMP) as shown in FIG. 7F, and timed etched to leave at the bottom of the emitter trench (785) a layer n+ emitter material (820a) of predetermined thickness, preferably of about 50 nm, as shown in FIG. 7G after the etching step.

Note that, the CMP process, although is not necessary, could improve the process controllability, since the etching step starts form the top of p+ polysilicon layers.

Unlike what happened in the third embodiment, now the region containing the HCBT transistor are not lower than the CMOS gate regions, because all polysilicon gates (both HCBT and CMOS) are almost at the same level. Hence, the CMP process is used as planarization step stopping at the surface of all polysilicon (or other material) gates, unlike, for example, in the third embodiment, where the higher CMOS gates would prevent the CMP process to reach the HCBT regions level.

Figure 7K:
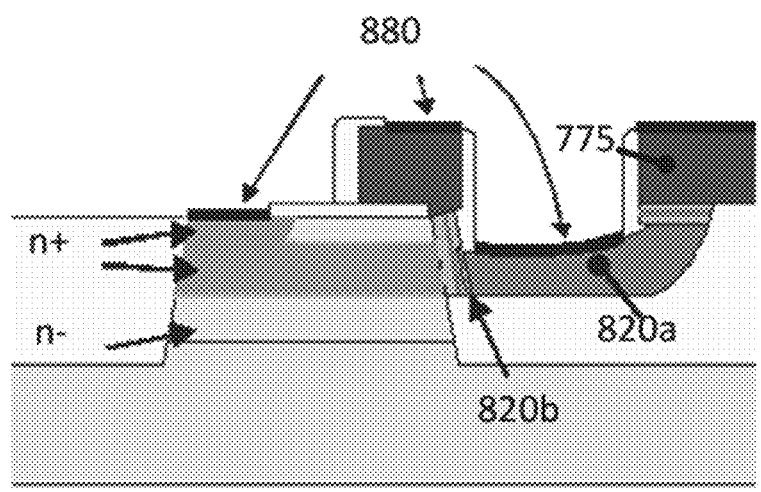

In the next steps of the process, the nitride layer (780) is removed by etch (FIG. 7H), oxide spacers are built at the sidewalls of the p+ polysilicon gates (770) (FIG. 7I), the n+ collector contact region (840) is implanted with mask (850) (FIG. 7J) and Silicides (880) are formed in the contact areas, as shown in FIG. 7K.

Next, during the annealing step used in HCBT the dopants diffuse form the p+ polysilicon extrinsic base region (770) into the base layered structure layer (795), forming the base contact region, which is equivalent to the extrinsic base region. Hence the base contact region comprises the p+ polysilicon (770) and the diffused region (820b) into the base layered structure layer (795) having an electrical contact with the intrinsic base (see the zoomed in portion of FIG. 7K). Annealing is also used to activate the n+ collector contact implantation region (840) (and eventually for the dopants activation in CMOS transistors) and for emitter diffusion of dopants form the deposited n+ emitter layer (820a) into the base layered structure layer (795).

The final SiGe HCBT structure of the fourth embodiment is shown in FIG. 7L. The base metal contact (B) is placed on top of p+ polysilicon extrinsic base regions (770), which could result in an increased base resistance as compared to the first, second and third embodiments, where the base contacts were directly formed on top of the base regions. However, since collector-base capacitance is reduced, the preferred embodiment depends on particular transistor application and the process parameters.

Figure 8:
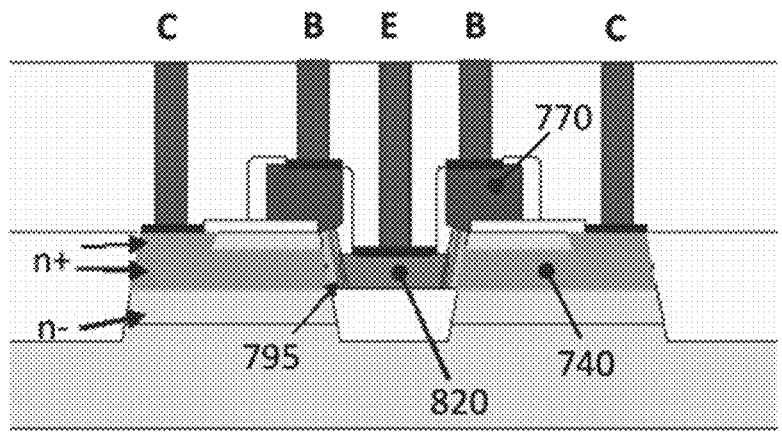
FIG. 8 shows SiGe HCBT with p+ polysilicon extrinsic base and with double intrinsic base regions and double n-hill regions.

As shown in FIG. 7L and FIG. 8, the implementation of the base contact region on top of the p+ polysilicon extrinsic base regions can also be used in SiGe HCBT with two adjacent base regions (as in the third embodiment).

Note that, the isolating oxide layer under the p+ polysilicon extrinsic base region, for example between the p+ polysilicon extrinsic base region (770) and the n-hill region (740) can be undercut during the etching of emitter trenches (785) as shown in FIG. 9A. The exact amount of undercut (910) depends on several factors, comprising oxide thickness and properties, capillary effect between the p+ polysilicon and the n-hill, etchant properties. In this case, the growth will start from p+ polysilicon extrinsic base region (770) and from the top of the n-hill (795) and will merge in between. The collector-base capacitance would increase consequently diminishing the advantage of this structure. In order to prevent this, the nitride layer (920) can be used under p+ polysilicon extrinsic base region (770) as in the second embodiment eventually reducing the undercut (910) as shown in FIG. 9B.

In the SiGe HCBT structure with the p+ polysilicon base contact region according to the fourth embodiment, the n+ heavily (or moderately) doped collector region (740) can be extended to the top of the n-hill (755), as shown in FIG. 10. There is no need for n− region above the n+ region (740) used to avoid n+/p+ junction, since there is no p+ region extending into the collector. In such structure, shown in FIG. 10, emitter n+ region (820) can be made shallower, requiring a smaller depth of emitter trench (785).

All Embodiments

The four embodiments described in the foregoing represent SiGe HCBT structures built on the bulk Silicon substrates. Alternatively, SiGe HCBT structures are compatible with Silicon-On-Insulator (SOI) substrates (111). For example, SiGe HCBT configured to have the extrinsic base coincident with the grown base layered structure layer including Si/SiGe/Si stack on a portion of the top of the n-hill region (as in the first embodiment) is shown in FIG. 11A, build on SOI substrate (111). The fabrication sequence used to build the SiGe HCBT in SOI substrate (111) is basically the same as for the bulk substrate.

According to this embodiment, the polysilicon gate used to shape the n+ emitter region is disposed directly on the buried oxide (112) or on the additional isolation oxide (113) as shown in FIG. 11A.

SiGe HCBT with double base regions (the third embodiment) can also be made in SOI technology resulting in a structure shown in FIG. 11B. Active SOI regions, their thickness and distance will serve to obtain the desired shape of n+ emitter region.

According to a further embodiment, the fabrication step of the collector layered structure layer is performed by epitaxial growth, instead of implantation. This step is implementable in all the four embodiments described in the foregoing.

Figure 14A:
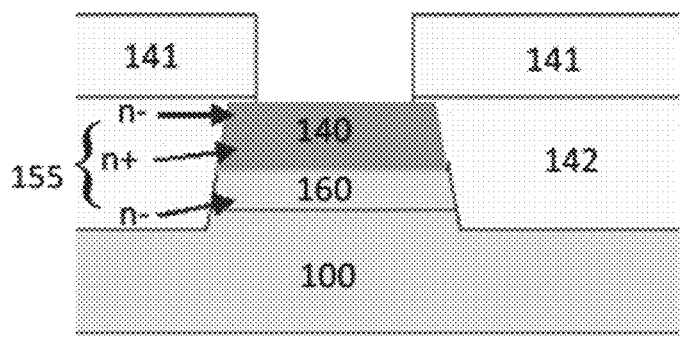
FIG. 14A to FIG. 14C show the SiGe HCBT with the epitaxially grown collector region process steps.

In FIG. 14 the process steps according to this embodiment of the method are shown. Additional isolating layer (141) is deposited over the entire surface after STI structure (142), heavily doped ion implanted and etched to expose the top surface of the n-hill region (155) by using additional mask (not shown in FIG. 14A).

Figure 14B:
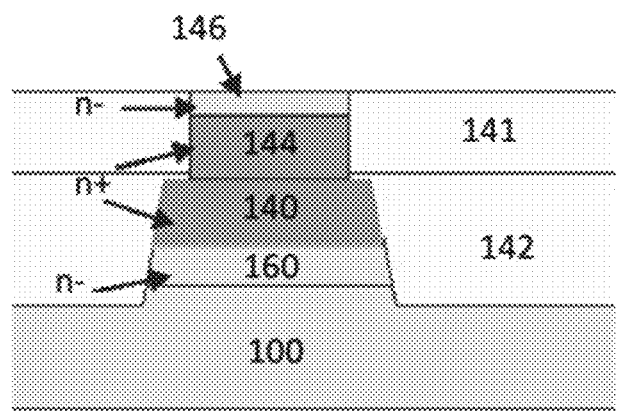
Figure 14C:
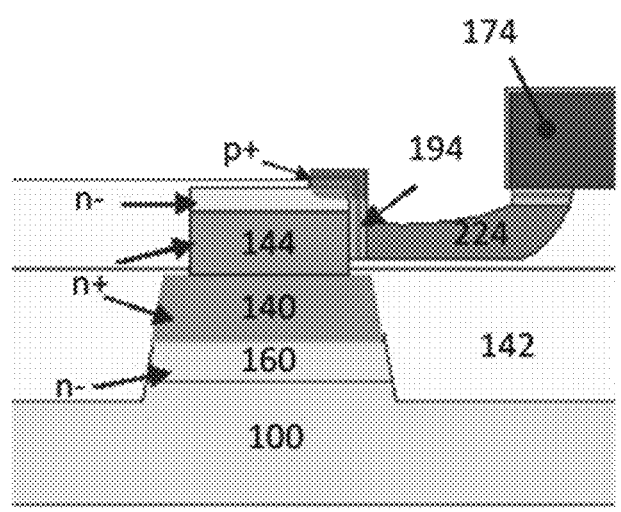

Next, a collector layered structure layer (144, 146) is grown by selective epitaxy from the exposed top surface of the n-hill layer (155). The grown collector layered structure layer comprises higher doped n+ region (144) at the bottom and low doped n− region (146) on top (FIG. 14B). In the case the epitaxial growth layer (146) is overgrown protruding from the additional oxide layer (141), it is planarized by using Chemical-Mechanical Polishing (CMP) process. According to this embodiment, the base layered structure layer (194) is grown on the base sidewall of the collector layered structure layer (144, 146) using basically the same process used for growing the structures on n-hill layered structure layer (155, 555, 655, 755) as described in the previous embodiments. The collector layered structure layer (144, 146) including the SiGe structure (194) is shown in FIG. 14C after etching the STI oxide to form the emitter trench and filling it with amorphous, crystalline or polycrystalline emitter layer (224), etched to a predefined thickness preferably of about 50 nm.

Electrical Characteristics

Figure 13A:
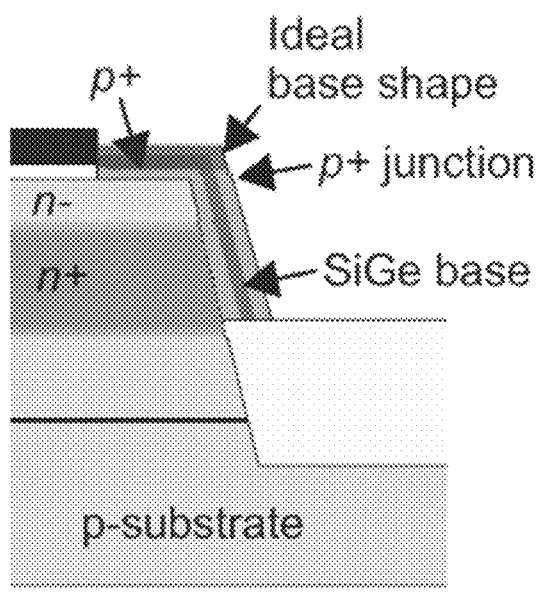
FIG. 13A and FIG. 13B show SiGe HCBT (a) with p+ extrinsic base in grown Si/SiGe/Si layer with: (a) ideal base shape, and (b) more realistic base shape.
Figure 13B:
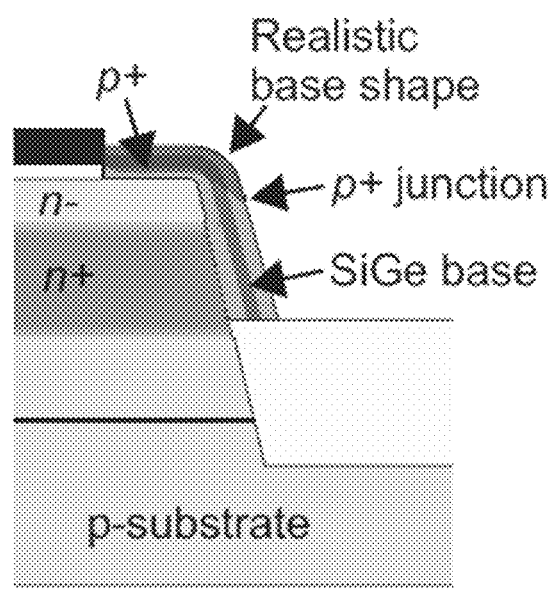

FIG. 12 shows simulated values of cutoff frequency (fT) and maximum frequency of oscillations (fmax) of the SiGe HCBT according to the present invention compared to corresponding values of the standard vertical-current SiGe HBT. A structure of the SiGe HCBT, having an ideal base shape, as shown in FIG. 13A, is used in the simulations, in contrast to a more realistic structure depicted in FIG. 13B. In the realistic structure, the corner at the top of the n-hill is not perfectly sharp, but it has a curvature. The grown base layered structure layer including Si/SiGe/Si stack is also expected to have a certain degree of curvature, as depicted in FIG. 13B. Such a rounded shape of the realistic grown base layer will be translated to the shape of the implanted p+ extrinsic base region (FIG. 13B) and it will be closer to the n+ emitter region, for example the intrinsic transistor region. The simulation of SiGe HCBT with such curved p+ extrinsic base region is added to the results in FIG. 12.

The SiGe HCBT with realistic base shape (FIG. 13B) has an improved fT and fmax. The extrinsic p+ region closer to the intrinsic transistor region reduces the base resistance. Alternatively, a shallower extrinsic base p+ implantation can be used to have similar base resistance as for the ideal base shape, resulting in reduced collector-base capacitance and improving fT and fmax.

Finally, it is clear that numerous modifications and variants can be made to the present invention, all falling within the scope of the invention, as defined in the appended claims.

The invention claimed is:

1. A method of manufacturing a semiconductor device including a Horizontal Current Bipolar Transistor (HCBT), characterized in that the process of manufacturing the HCBT comprises the steps of:
   providing a wafer substrate;
   forming at least one hill region by etching said wafer substrate, said at least one hill region having a top surface and a sidewall, said sidewall being inclined at an acute angle to said top surface;
   depositing an isolation layer on said wafer substrate and planarizing said isolation layer;
   forming a doped collector region in said at least one hill region by a first ion implantation step, said doped collector region comprising a highly or moderately doped n+layer and a low doped n-layer, wherein said low doped n-layer is proximal to said top surface;
   depositing a silicon nitride film on said wafer substrate;
   opening an emitter trench in said silicon nitride film and said isolation layer exposing an active area of said HCBT, said active area consisting of at least a portion of one sidewall and at least a portion of said top surface of said at least one hill region;
   epitaxially growing a base layered structure layer on said active area, said base layered structure layer comprising at least one layer made of silicon-germanium alloy or silicon-germanium-carbon alloy;
   forming an extrinsic base region and an intrinsic base region within said base layered structure layer by a second ion implantation step, wherein said extrinsic base region and said intrinsic base region are mutually exclusive regions and said extrinsic base region has been ion implanted in said second ion implantation step;
   forming an emitter contact region within said emitter trench by depositing a heavily doped amorphous or polycrystalline silicon layer over said wafer substrate and partially removing said heavily doped amorphous or polycrystalline silicon layer;
   forming a collector contact region within said at least one hill region by a third ion implantation step, said collector contact region electrically coupled to said highly or moderately doped n+layer;

forming an emitter diffusion region in said intrinsic base region by annealing, said emitter diffusion region formed by diffusion of emitter dopants from said emitter contact region;

forming a collector electrode electrically coupled to said collector contact region, forming a base electrode electrically coupled to said extrinsic base region; and forming a emitter electrode electrically coupled to said emitter contact region.

2. The method according to claim 1, wherein said step of forming a doped collector region in said at least one hill region by a first ion implantation step, is followed by a step of forming a dummy polysilicon gate region on top of said isolation layer.

3. The method according to claim 1, wherein said step of partially removing said heavily doped amorphous or polycrystalline silicon layer is performed using an etchant selected from a group consisting of etchant selective to high p-doping, etchant selective to silicon-germanium alloy, and etchant selective to silicon-germanium-carbon alloy.

4. The method according to claim 3, wherein said etchant comprises Tetramethyl Ammonium Hydroxide (TMAH).

5. The method according to claim 1, wherein said step of forming an extrinsic base region and an intrinsic base region is followed by a step of forming a protective layer on the top of said base layered structure layer, and wherein said step of partially removing said heavily doped amorphous or polycrystalline silicon layer is performed using an etchant selective to said protective layer.

6. The method according to claim 1, wherein said second ion implantation is performed at an oblique angle relative to said top surface.

7. A method of manufacturing two horizontal current bipolar transistors (HCBT-s) with electrically coupled emitters comprising steps of:

providing a wafer substrate;

forming a first hill region and a second hill region by etching said wafer substrate, said first hill region having a first top surface and a first sidewall and said second hill region having a second top surface and a second sidewall, said first sidewall being inclined at an acute angle to said first top surface, said second sidewall being inclined at an acute angle to said second top surface, and said first sidewall and said second sidewall facing each other;

depositing an isolation layer on said wafer substrate and planarizing said isolation layer;

forming first doped collector region in said first hill region by a first ion implantation step, said first doped collector region comprising a first highly or moderately doped n+layer and a first low doped n-layer, wherein said first low doped n-layer is proximal to said first top surface;

forming second doped collector region in said second hill region by said first ion implantation step, said second doped collector region comprising a second highly or moderately doped n+layer and a second low doped n-layer, wherein said second low doped n-layer is proximal to said second top surface;

depositing a silicon nitride film on said wafer substrate;

opening an emitter trench in said silicon nitride film and said isolation layer between said first hill region and said second hill region thereby exposing a first active area of a first HCBT and a second active area of a second HCBT, said first active area consisting of at least a portion of said first sidewall and at least a portion of said first top surface and said second active area consisting of at least a portion of second sidewall and at least a portion of said second top surface, said step of opening said emitter trench defining a region A as an unetched portion of said silicon nitride film;

epitaxially growing a first base layered structure layer on said first active area and a second base layered structure layer on said second active area, said first base layered structure layer and said second base layered structure layer comprising at least one layer made of silicon-germanium alloy or silicon-germanium-carbon alloy;

forming a heavily doped silicon region within said emitter trench, said heavily doped silicon region is in electrical contact with said first base layered structure layer and said second base layered structure layer;

forming a first extrinsic base region and first intrinsic base region within said first base layered structure layer by a second ion implantation step and forming a second extrinsic base region and second intrinsic base region within said second base layered structure layer by said second ion implantation step, wherein said first extrinsic base region, said first intrinsic base region, said second extrinsic base region and said second intrinsic base region are all mutually exclusive regions and said first extrinsic base region and said second extrinsic base region have both been ion implanted in said second ion implantation step;

forming an emitter contact region within said emitter trench by partially removing said heavily doped silicon layer;

forming first collector contact region within said first hill region by a third ion implantation step, said first collector contact region electrically coupled to said first highly or moderately doped n-layer;

forming second collector contact region within said second hill region by said third ion implantation step, said second collector contact region electrically coupled to said second highly or moderately doped n-layer;

forming first emitter diffusion region in said first intrinsic base region by annealing, said first emitter diffusion region formed by diffusion of emitter dopants from said emitter contact region;

forming second emitter diffusion region in said second intrinsic base region by annealing, said second emitter diffusion region formed by diffusion of emitter dopants from said emitter contact region;

forming a first collector electrode electrically coupled to said first collector contact region and forming a second collector electrode electrically coupled to said second collector contact region, forming a first base electrode electrically coupled to said first extrinsic base region and forming a second base electrode electrically coupled to said second extrinsic base region; and forming an emitter electrode electrically coupled to said emitter contact region.

8. The method of claim 7, wherein said step of forming a heavily doped silicon region further comprises steps of, depositing a heavily doped amorphous or polycrystalline silicon layer over said wafer substrate and removing said heavily doped amorphous or polycrystalline silicon layer over said region A.

9. The method of claim 8, wherein said step of removing said heavily doped amorphous or polycrystalline silicon layer over said region A, comprises chemical-mechanical polishing (CMP).

10. The method of claim 7, wherein said step of forming a heavily doped silicon region further comprises steps of,
epitaxially growing a first heavily doped crystalline silicon region on said first base layered structure layer and growing a second heavily doped crystalline silicon region on said second base layer structure layer, wherein said first heavily doped crystalline silicon region and said second heavily doped crystalline silicon region are contiguous, forming a contiguous heavily doped silicon region;
partially removing said contiguous heavily doped silicon region.

11. The method according to claim 10, wherein said step of partially removing said contiguous heavily doped silicon region, comprises chemical-mechanical polishing (CMP).

12. The method according to claim 7, wherein a portion of said heavily doped silicon region is protected by a photoresist mask during said second ion implantation step.

13. A method of manufacturing a semiconductor device including a Horizontal Current Bipolar Transistor (HCBT), characterized in that the process of manufacturing the HCBT comprises the steps of:
providing a wafer substrate;
forming at least one hill region by etching said wafer substrate, said at least one hill region having a top surface and a sidewall, said sidewall being inclined at an acute angle to said top surface;
depositing an isolation layer on said wafer substrate and planarizing said isolation layer;
forming a doped collector region in said at least one hill region by a first ion implantation step, said doped collector region comprising a highly or moderately doped n+layer and a low doped n-layer, wherein said low doped n-layer is proximal to said top surface;
depositing a polysilicon layer over said wafer substrate;
depositing a first silicon nitride layer on top of said polysilicon layer;
forming a dummy polysilicon gate region on top of said isolation layer and a polysilicon extrinsic base region overlaying at least a portion of said one hill region within said polysilicon layer by selective etching of said polysilicon layer, preceded by selective removal of said first silicon nitride layer;
encapsulating said dummy polysilicon gate region and said polysilicon extrinsic base region by depositing a second silicon nitride layer over said wafer substrate and anisotropically etching said second silicon nitride layer, wherein said encapsulation step forms a silicon nitride coating at the sidewalls of said dummy polysilicon gate region and said polysilicon extrinsic base region;
opening an emitter trench in said isolation layer exposing an active area of said HCBT, said active area comprising at least a portion of one sidewall, said emitter trench disposed under at least a portion of said dummy polysilicon gate region and at least a portion of said polysilicon extrinsic base region;
epitaxially growing a layered intrinsic base region on said active area, said layered intrinsic base region comprising at least one layer made of silicon-germanium alloy or silicon-germanium-carbon alloy, said layered intrinsic base region electrically coupled to said polysilicon extrinsic base region;
forming an emitter contact region within said emitter trench by depositing a heavily doped amorphous or polycrystalline silicon layer over said wafer substrate and partially removing said heavily doped amorphous or polycrystalline silicon layer;
forming a collector contact region within said at least one hill region by a third ion implantation step, said collector contact region electrically coupled to said highly or moderately doped n+layer;
forming an emitter diffusion region in said intrinsic base region by annealing, said emitter diffusion region formed by diffusion of emitter dopants from said emitter contact region;
forming a collector electrode electrically coupled to said collector contact region,
forming a base electrode electrically coupled to said polysilicon extrinsic base region; and
forming a emitter electrode electrically coupled to said emitter contact region.

14. The method according to claim 13, further characterized with said polysilicon extrinsic base region extending above at least a portion of said sidewall.

15. The method according to claim 13, wherein said step of forming a doped collector region is followed by a step of depositing a layered structure layer comprising silicon nitride or silicon oxide or both on top of said wafer substrate.

16. The method according to claim 13, wherein
said step of partially removing said heavily doped amorphous or polycrystalline silicon layer over said dummy gate region and said base polysilicon gate region comprises the process of chemical-mechanical polishing (CMP).

17. The method according to claim 13, wherein
said polysilicon extrinsic base region is formed above each of at least two said hill regions adjacent to each other, said polysilicon extrinsic base regions overlapping with at least two hill regions' edges facing each other, with said emitter trench disposed between said two polysilicon extrinsic base regions.

18. The method according to claim 13, wherein
said dummy polysilicon gate region and said polysilicon extrinsic base region are fabricated using standard CMOS gate process steps.

* * * * *